(12) United States Patent
Shin et al.

(10) Patent No.: US 11,917,822 B2
(45) Date of Patent: Feb. 27, 2024

(54) THREE-DIMENSIONAL SEMICONDUCTOR MEMORY DEVICES

(71) Applicant: Samsung Electronics Co., Ltd., Suwon-si (KR)

(72) Inventors: Seungjun Shin, Yongin-si (KR); Siwan Kim, Hwaseong-si (KR); Bonghyun Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 402 days.

(21) Appl. No.: 17/036,997

(22) Filed: Sep. 29, 2020

(65) Prior Publication Data

US 2021/0242236 A1   Aug. 5, 2021

(30) Foreign Application Priority Data

Feb. 5, 2020 (KR) .................. 10-2020-0013729

(51) Int. Cl.
| | |
|---|---|
| *H10B 43/27* | (2023.01) |
| *H01L 23/522* | (2006.01) |
| *H10B 41/10* | (2023.01) |
| *H10B 41/27* | (2023.01) |
| *H10B 43/10* | (2023.01) |

(52) U.S. Cl.
CPC ......... *H10B 43/27* (2023.02); *H01L 23/5226* (2013.01); *H10B 41/10* (2023.02); *H10B 41/27* (2023.02); *H10B 43/10* (2023.02)

(58) Field of Classification Search
CPC ........... H01L 27/11582; H01L 27/1157; H01L 27/11556; H01L 27/11565; H01L 27/11575; H10B 43/27; H10B 41/27; H10B 43/35; H10B 43/10; H10B 43/40
See application file for complete search history.

(56) References Cited

U.S. PATENT DOCUMENTS

| | | | |
|---|---|---|---|
| 8,044,448 | B2 | 10/2011 | Kamigaichi et al. |
| 9,502,349 | B2 | 11/2016 | Chen |
| 9,583,503 | B1 | 2/2017 | Lee |
| 10,269,817 | B2 | 4/2019 | Ogawa et al. |
| 2017/0301684 | A1 | 10/2017 | Park et al. |
| 2018/0026047 | A1 | 1/2018 | Park et al. |
| 2019/0139979 | A1* | 5/2019 | Kanamori ........... H01L 27/1157 |
| 2019/0148400 | A1 | 5/2019 | Song et al. |
| 2019/0164991 | A1 | 5/2019 | Lim et al. |

* cited by examiner

*Primary Examiner* — Tony Tran
(74) *Attorney, Agent, or Firm* — Myers Bigel, P.A.

(57) ABSTRACT

A three-dimensional (3D) semiconductor memory device includes electrode structures including a plurality of electrodes stacked on a semiconductor substrate, and the electrode structures extend in a first direction and are spaced apart from each other by separation regions in a second direction perpendicular to the first direction. The 3D semiconductor memory device includes ground select gate electrodes comprising lowermost electrodes among the plurality of electrodes of the electrode structures, wherein on a level of the ground select gate electrodes, the separation regions include a first end portion, and at least one ground select gate cutting region overlaps the first end portion of the separation regions and electrically isolates the ground select gate electrodes from each other.

17 Claims, 30 Drawing Sheets

FIG. 12A
FIG. 12B
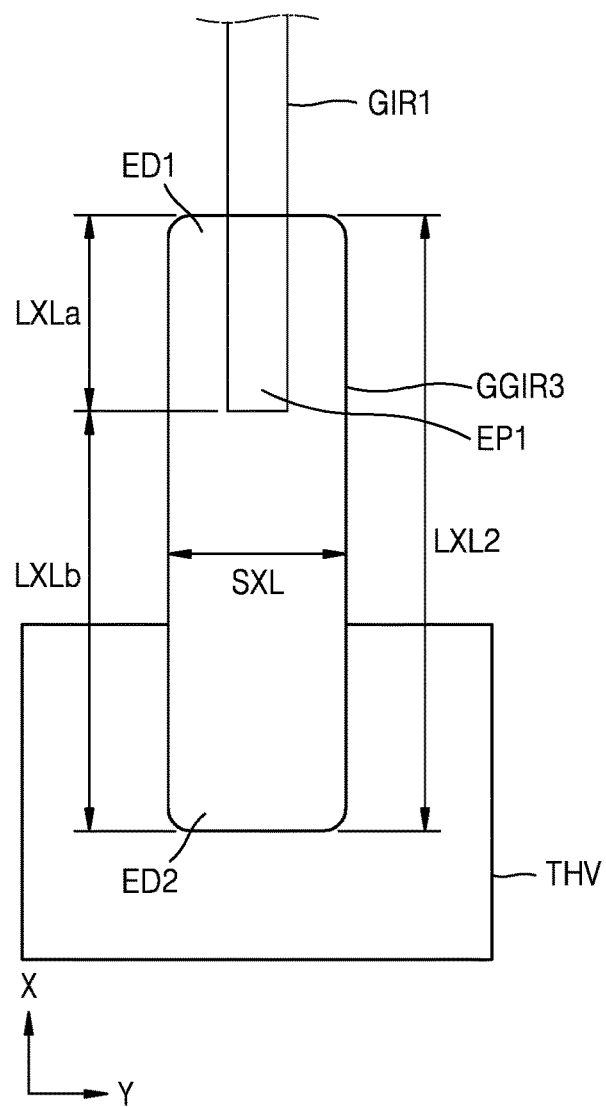
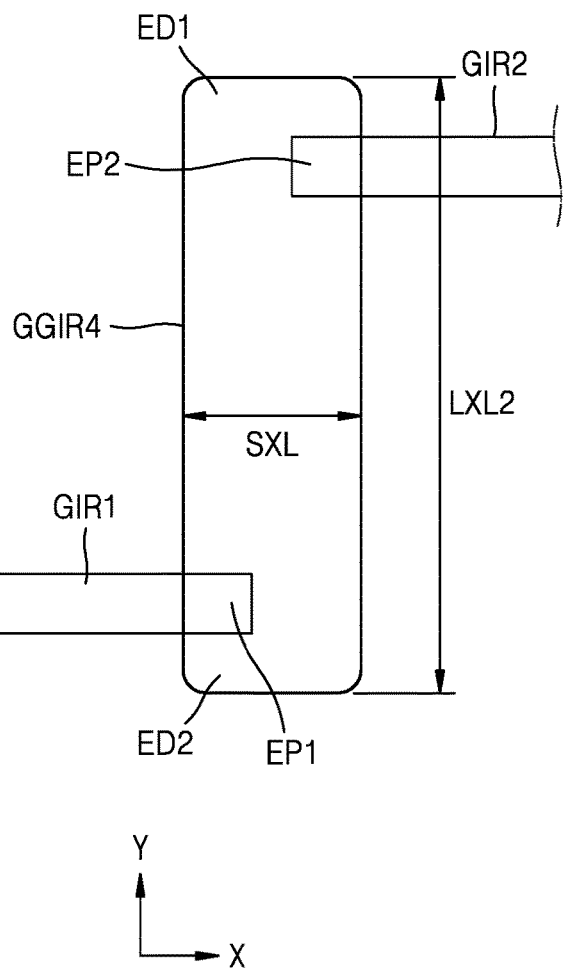

THREE-DIMENSIONAL SEMICONDUCTOR MEMORY DEVICES

CROSS-REFERENCE TO RELATED APPLICATION

This application claims the benefit of Korean Patent Application No. 10-2020-0013729, filed on Feb. 5, 2020 in the Korean Intellectual Property Office, the disclosure of which is incorporated herein in its entirety by reference.

BACKGROUND

The present disclosure relates to semiconductor memory devices. To meet excellent performance and low price required by consumers, a degree of integration of semiconductor memory devices may be increased. In the case of a two-dimensional or planar semiconductor memory device, it is difficult to reduce an area occupied by a unit memory cell, and thus, it is difficult to improve the degree of integration. Accordingly, three-dimensional (3D) semiconductor memory devices having memory cells arranged in three dimensions have been proposed.

SUMMARY

The inventive concept provides a three-dimensional (3D) semiconductor memory device having improved reliability and degree of integration.

According to an aspect of the inventive concept, there is provided a 3D semiconductor memory device including: a semiconductor substrate; electrode structures including a plurality of electrodes stacked on the semiconductor substrate, the electrode structures extending in a first direction and being spaced apart from each other by separation regions in a second direction perpendicular to the first direction; ground select gate electrodes including lowermost electrodes among the plurality of electrodes of the electrode structures, wherein the separation regions include a first end portion on a level of the ground select gate electrodes; and at least one ground select gate cutting region that overlaps the first end portion of the separation regions and electrically isolates the ground select gate electrodes from each other.

According to another aspect of the inventive concept, there is provided a three-dimensional (3D) semiconductor memory device including: a peripheral logic structure on a semiconductor substrate; a horizontal semiconductor layer on the peripheral logic structure, the horizontal semiconductor layer including a cell array region and a connection region electrically connected to the cell array region; electrode structures including a plurality of electrodes stacked on the horizontal semiconductor layer in the cell array region and the connection region, the electrode structures extending in a first direction and being spaced apart from each other by separation regions in a second direction perpendicular to the first direction; at least one contact region including a through wiring structure electrically connecting the electrode structures to the peripheral logic structure in the connection region; and ground select gate electrodes including lowermost electrodes among the plurality of electrodes of the electrode structures in the cell array region and the connection region, wherein the separation regions include a first end portion on a level of the ground select gate electrodes, and at least one ground select gate cutting region overlaps the first end portion of the separation regions and electrically isolates the ground select gate electrodes from each other.

According to another aspect of the inventive concept, there is provided a three-dimensional (3D) semiconductor memory device including: a peripheral logic structure on a semiconductor substrate; a horizontal semiconductor layer on the peripheral logic structure, the horizontal semiconductor layer including a cell array region and a connection region electrically connected to the cell array region; electrode structures including a plurality of electrodes stacked on the horizontal semiconductor layer in the cell array region and the connection region, the electrode structures each extending in a first direction and being spaced apart from each other by at least one separation region in a second direction perpendicular to the first direction; at least one contact region including a through wiring structure electrically connecting the electrode structures to the peripheral logic structure in the connection region; and ground select gate electrodes including lowermost electrodes among the plurality of electrodes of the electrode structures in the cell array region and the connection region, wherein the at least one separation region includes a first end portion on a level of the ground select gate electrodes, and at least one ground select gate cutting region overlaps the first end portion of the at least one separation region and electrically isolates the ground select gate electrodes from each other.

BRIEF DESCRIPTION OF THE DRAWINGS

Embodiments of the inventive concept will be more clearly understood from the following detailed description taken in conjunction with the accompanying drawings in which:

FIGS. 12A and 12B are layout diagrams illustrating a planar overlap relationship between an isolation region, a contact region, and a ground select gate cutting region of a 3D semiconductor memory device, according to an embodiment of the inventive concept;

DETAILED DESCRIPTION

Figure 1:
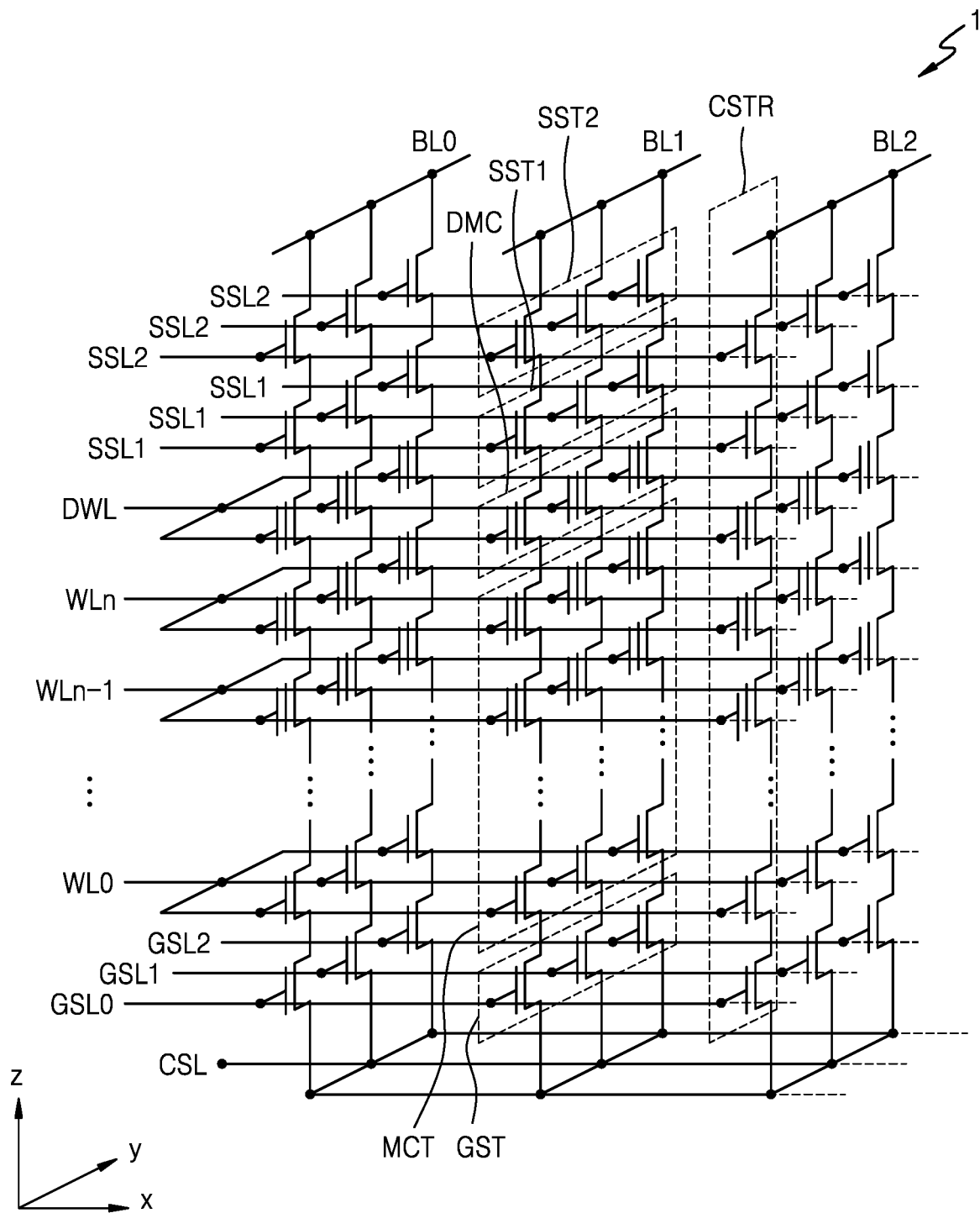
FIG. 1 is a circuit diagram illustrating a cell array of a three-dimensional (3D) semiconductor memory device, according to an embodiment of the inventive concept.

Hereinafter, embodiments of the inventive concept are described in detail with reference to the accompanying drawings. Identical reference numerals are used for the same constituent elements in the drawings, and duplicate descriptions thereof may be omitted.

FIG. 1 is a circuit diagram illustrating a cell array 1 of a three-dimensional (3D) semiconductor memory device, according to an embodiment of the inventive concept.

The cell array 1 of the 3D semiconductor memory device may include a common source line CSL, zeroth through second bit lines BL0 through BL2, and a plurality of cell strings CSTR between the common source line CSL and the zeroth through second bit lines BL0 through BL2.

The plurality of cell strings CSTR may extend in a third direction (Z direction) on/from a plane extending in a first direction (X direction) and a second direction (Y direction). The zeroth through second bit lines BL0 through BL2 may be spaced apart from each other in the first direction (X direction) and may extend in the second direction (Y direction).

The plurality of cell strings CSTR may be connected to each of the zeroth through second bit lines BL0 through BL2 in parallel. The plurality of cell strings CSTR may be connected to the common source line CSL in common. In other words, the plurality of cell strings CSTR may be between the zeroth through second bit lines BL0 through BL2 and one (i.e., the same) common source line CSL. The common source lines CSL may be arranged in plural two-dimensionally.

In this case, the electrically same voltage may be applied to the common source lines CSL, or each of the common source lines CSL may be electrically controlled. In an embodiment, each of the cell strings CSTR may include a first string select transistor SST1 and a second string select transistor SST2, which are connected in series, series-connected memory cells MCT, and a ground select transistor GST. Each of the memory cells MCT may include a data storage element.

In an embodiment, each cell string CSTR may include the first and second string select transistors SST1 and SST2 connected in series, the second string select transistor SST2 may be connected to the zeroth through second bit lines BL0 through BL2, and the ground select transistor GST may be connected to the common source line CSL. The memory cells MCT may be connected in series between the first string select transistor SST1 and the ground select transistor GST.

Each of the cell strings CSTR may further include a dummy cell DMC connected between the first string select transistor SST1 and the memory cell MCT. Although not illustrated in FIG. 1, the dummy cell DMC may also be connected between the ground select transistor GST and the memory cell MCT. As another example, in each of the cell strings CSTR, the ground select transistor GST, similar to the first and second string select transistors SST1 and SST2, may include a plurality of metal-oxide-semiconductor (MOS) transistors connected in series. As another example, each of the cell strings CSTR may include one string select transistor.

In an embodiment, the first string select transistor SST1 may be controlled by a first string select line SSL1, and the second string select transistor SST2 may be controlled by a second string select line SSL2. The memory cells MCT may be controlled by zeroth through nth word lines WL0 through WLn, and the dummy cells DMC may be controlled by a dummy word line DWL. In addition, the ground select transistor GST may be controlled by zeroth through second ground select lines GSL0 through GSL2. The common source line CSL may be commonly connected to the sources of the ground selection transistors GST.

One cell string CSTR may include a plurality of memory cells MCT having different distances from the common source lines CSL. In addition, the zeroth through nth word lines WL0 through WLn and the dummy word line DWL may be between the common source lines CSL and the zeroth through second bit lines BL0 through BL2.

Gate electrodes of the memory cells MCT and the dummy cell DMC that are at substantially the same distance from the common source lines CSL may be connected to one of the zeroth through nth word lines WL0 through WLn in common, and accordingly, may be in an equipotential state. Unlike this case, even when the gate electrodes of the memory cells MCT are on substantially the same level from the common source lines CSL, the gate electrodes on different rows or columns may be independently controlled. In FIG. 1, the zeroth through nth word lines WL0 through WLn and the dummy word line DWL are illustrated as being respectively connected to three gate electrodes, but may be connected to respective gate electrodes as needed.

The zeroth through second ground select lines GSL0 through GSL2 and the first and second string select lines SSL1 and SSL2 may extend in the first direction (X direction) and may be spaced apart from each other in the second direction (Y direction). The zeroth through second ground select lines GSL0 through GSL2 may be on substantially the same level from the common source lines CSL. The first and second string selection lines SSL1 and SSL2 may be on substantially different levels from the common source lines CSL. The first and second string select lines SSL1 and SSL2 may be electrically isolated from each other.

Figure 2:
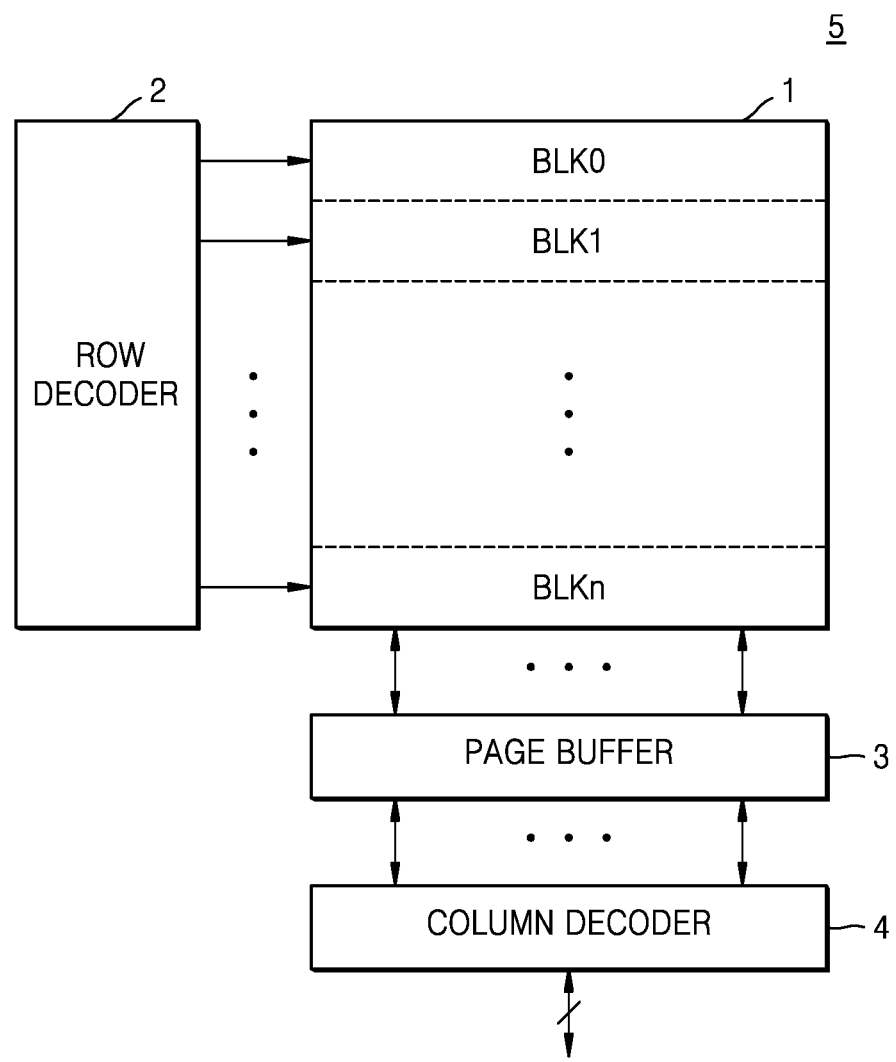
FIG. 2 is a block diagram illustrating constituent components of a 3D semiconductor memory device, according to an embodiment of the inventive concept.

FIG. 2 is a block diagram illustrating constituent components of a 3D semiconductor memory device 5, according to an embodiment of the inventive concept.

The 3D semiconductor memory device 5 may include a cell array 1 and peripheral circuits (2, 3, and 4). The peripheral circuits (2, 3, and 4) may include a row decoder 2, a page buffer 3, and a column decoder 4.

The cell array 1 may include a 3D cell array including a plurality of memory cells. The cell array 1 may, as described above with reference to FIG. 1, include the plurality of memory cells, and a plurality of word lines and a plurality of bit lines that are electrically connected to the plurality of memory cells. In an embodiment, the cell array 1 may include zeroth through nth memory blocks BLK0 through BLKn that are data erase units.

The row decoder 2 may select the word lines of the cell array 1. The row decoder 2 may select one of the zeroth through nth memory blocks BLK0 through BLKn of the cell array 1 according to address information and select one of the word lines of the selected one of the zeroth through nth memory blocks BLK0 through BLKn of the cell array 1. The row decoder 2 may provide a word line voltage generated by a voltage generating circuit (not illustrated) to selected word lines and unselected word lines, respectively, in response to a control of a control circuit (not illustrated).

The page buffer 3 may write information to the memory cells or read information stored in the memory cells. The page buffer 3 may, according to some operation modes, temporarily store data to be stored in the memory cells, or may sense data stored in the memory cells. The page buffer 3 may operate as a write driver circuit in a program operation mode and may operate as a sense amplifier circuit in a read operation mode.

The column decoder 4 may be connected to the bit lines of the cell array 1. The column decoder 4 may provide a data transmission path between the page buffer 3 and an external device (for example, a memory controller).

Figure 3:
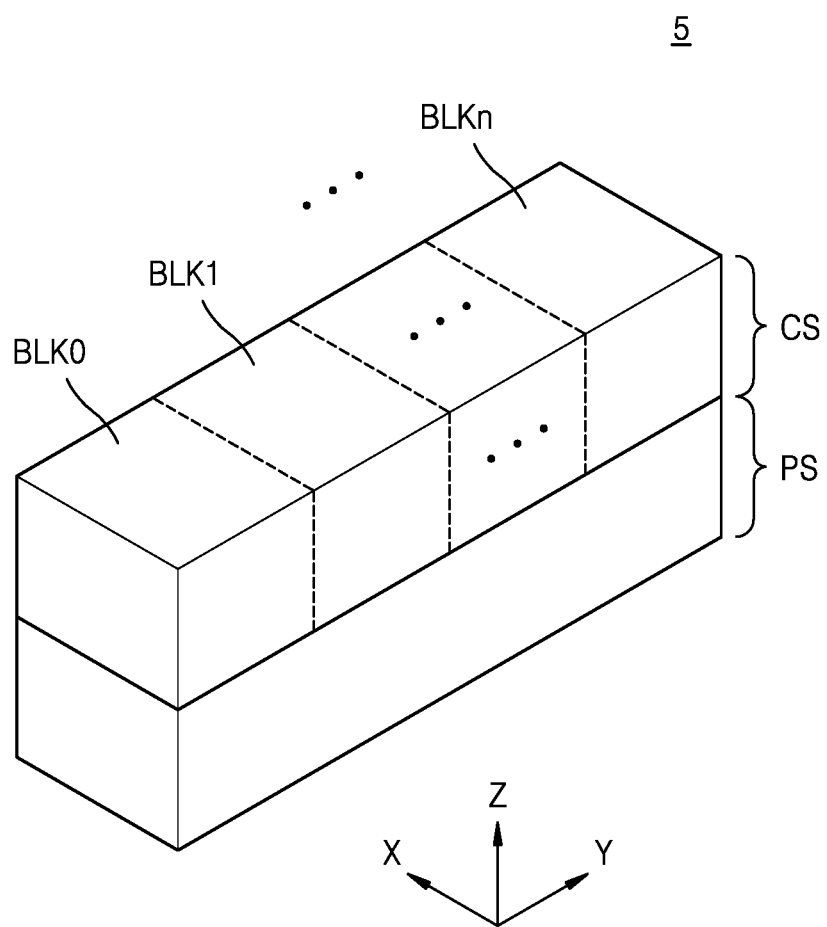
FIG. 3 is a perspective view illustrating a structure of a 3D semiconductor memory device, according to an embodiment of the inventive concept.

FIG. 3 is a perspective view illustrating a structure of the 3D semiconductor memory device 5, according to an embodiment of the inventive concept.

The 3D semiconductor memory device 5 may include a peripheral logic structure PS and a cell array structure CS. The cell array structure CS may be stacked on the peripheral logic structure PS. The peripheral logic structure PS may overlap the cell array structure CS in a plan view.

The cell array structure CS may include the zeroth through $n^{th}$ memory blocks BLK0 through BLKn, which are data erase units. Each of the zeroth through $n^{th}$ memory blocks BLK0 through BLKn may include the cell array (1 in FIG. 2) having a 3D structure (or a vertical structure).

The cell array 1 may include the plurality of memory cells MTC arranged three-dimensionally as illustrated with reference to FIG. 1, and the zeroth through nth word lines WL0 through WLn and the zeroth through second bit lines BL0 through BL2 that are electrically connected to the plurality of memory cells MTC. The peripheral logic structure PS may include the peripheral circuits (2, 3 and 4) controlling the cell array 1. The peripheral circuits (2, 3, and 4) may include the row decoder 2, the page buffer 3, and the column decoder 4, which are illustrated in FIG. 2, and in addition, may include a control circuit for controlling the zeroth through $n^{th}$ memory blocks BLK0 through BLKn.

Hereinafter, various layouts and structures of 3D semiconductor memory devices, according to embodiments of the inventive concept, are described as examples. The layouts described below do not limit the inventive concept, and the same or similar reference numerals may denote the same or similar members.

Figure 4:
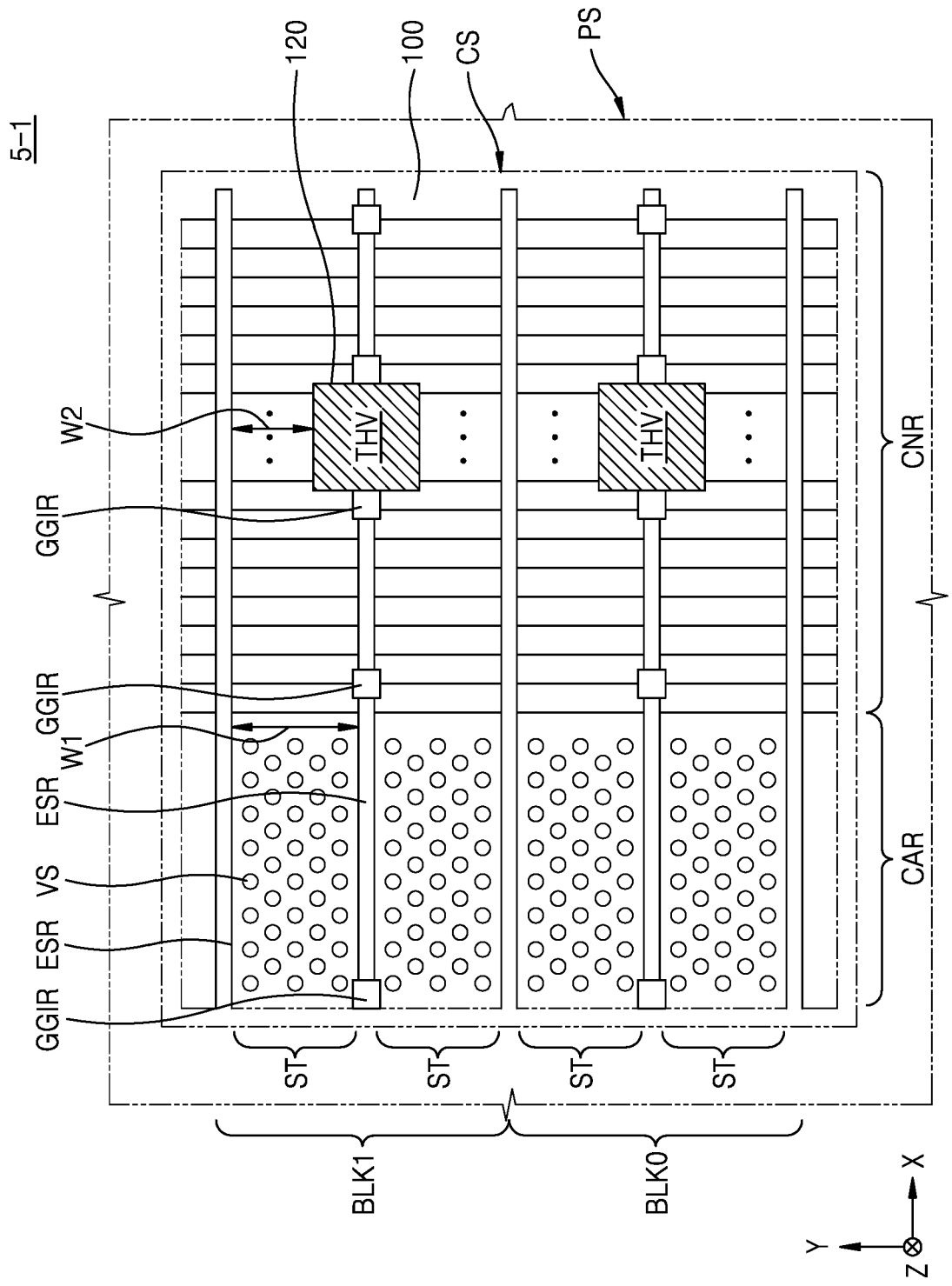
FIG. 4 is a schematic layout diagram illustrating a 3D semiconductor memory device, according to an embodiment of the inventive concept.

FIG. 4 is a schematic layout diagram illustrating a 3D semiconductor memory device 5-1, according to an embodiment of the inventive concept.

The 3D semiconductor memory device 5-1 according to an embodiment of the inventive concept may illustrate two memory blocks, the zeroth and first memory blocks BLK0 and BLK1, for convenience. Each of the zeroth and first memory blocks BLK0 through BLK1 may include a plurality of electrode structures ST, but in FIG. 4, is illustrated to include two electrode structures ST.

The 3D semiconductor memory device 5-1 may include the peripheral logic structure PS on a semiconductor substrate (not illustrated), the cell array structure CS on the peripheral logic structure PS, and a through wiring structure THV electrically connecting the cell array structure CT to the peripheral logic structures PS.

The peripheral logic structure PS may include peripheral logic circuits that process data input/output to/from the cell array. The cell array structure CS may include the plurality of electrode structures ST arranged on a horizontal semiconductor layer 100 located on a semiconductor substrate (not illustrated), and a plurality of vertical structures VS penetrating each of the electrode structures ST. Each of the electrode structures ST may include a plurality of electrodes, for example, cell gate electrodes and ground select gate electrodes.

As described herein, among the electrodes of the electrode structures ST, the ground select gate electrode may be in or on a lowermost layer of electrodes. The vertical structures VS may include memory cells. In some embodiments, the cell array structure CS may overlap the peripheral logic structure PS in a plan view.

The horizontal semiconductor layer 100 on the semiconductor substrate (not illustrated) may include a cell array region CAR in which the memory cells are provided, and a connection region CNR electrically connected to the cell array region CAR. The connection region CNR may include conductive lines connected to the memory cells and contact plugs. A first contact region 120 including the through wiring structure THV may be formed in the connection region CNR. The first contact region 120 may include an insulating layer that is not substituted with metal during an electrode forming process. In other words, the first contact region 120 may include an insulating layer formed in a region in which the first contact region 120 is not substituted with a metal during the electrode forming process. In some embodiments, the first contact region 120 may include a silicon oxide layer or a silicon nitride layer.

The electrode structures ST may extend on the horizontal semiconductor layer 100 in the first direction (X direction). The electrode structures ST adjacent to each other may be spaced apart from each other by an electrode separation region ESR provided therebetween in the second direction (Y direction) perpendicular to the first direction (X direction). The electrode separation region ESR may be in a straight pattern without being curved or bent in the first direction (X direction). The electrode separation region ESR may be referred to as a separation region. Moreover, the term "separation regions" may refer to (i) multiple electrode separation regions ESR, (ii) multiple gate isolation regions GIR (FIG. 6), or (iii) a combination of one or more electrode separation regions ESR and one or more gate isolation regions GIR.

The 3D semiconductor memory device 5-1 may include at least one ground select gate cutting region GGIR that overlaps the electrode separation region ESR or the first contact region 120 on a level of the ground select gate electrodes in a plan view. For example, the ground select gate cutting region GGIR may overlap one or more separation regions in the third direction (Z direction).

The ground select gate cutting region GGIR may be formed in at least one of the cell array region CAR and the connection region CNR. The ground select gate cutting region GGIR may be formed between the cell array region CAR and the connection region CNR in the first direction (X direction). The ground select gate cutting region GGIR may be in contact with or overlap the first contact region 120 that is in the connection region CNR.

Overlap relationships between the electrode separation region ESR and the first contact region 120 and between the ground select gate cutting regions GGIR are described in detail later. The ground select gate cutting region GGIR may electrically isolate the ground select gate electrodes from each other, and accordingly, may improve the reliability of the 3D semiconductor memory device 5-1.

In some embodiments, each of the electrode structures ST may include a first wiring portion having a first width W1 and a second wiring portion having a second width W2 less than the first width W1. The second wiring portions of the electrode structures ST adjacent to each other may face each other. A pair of electrode structures ST adjacent to each other may be arranged in a mirror-symmetry. At least one first contact region 120 exposing a portion of the horizontal semiconductor layer 100 may be arranged in the pair of electrode structures ST adjacent to each other. The first contact region 120 may be between the second wiring portions of the electrode structures ST. In some embodiments, the first contact region 120 may be between the electrode structures ST in the second direction (Y direction).

The first contact region 120 may be variously arranged as needed. In some embodiments, at least one first contact region 120 may be in any one of the zeroth and first memory blocks BLK0 and BLK1. For example, at least one first contact region 120 may be in the zeroth memory block BLK0. In some embodiments, the first contact region 120 may be inside the electrode structures ST in the first direction (X direction).

In some embodiments, the first contact region 120 may not be arranged in any one of the zeroth and first memory blocks BLK0 and BLK1. For example, when the first contact region 120 is not arranged in the zeroth memory block BLK0, a first contact region (not illustrated) may be formed in the connection region CNR that is arranged in a -X direction opposite to the X direction.

The 3D semiconductor memory device 5-1 described above may improve the reliability while increasing the degree of integration by including the peripheral logic structure PS, vertical structures VS including the memory cells, and the ground select gate cutting region GGIR.

Figure 5:
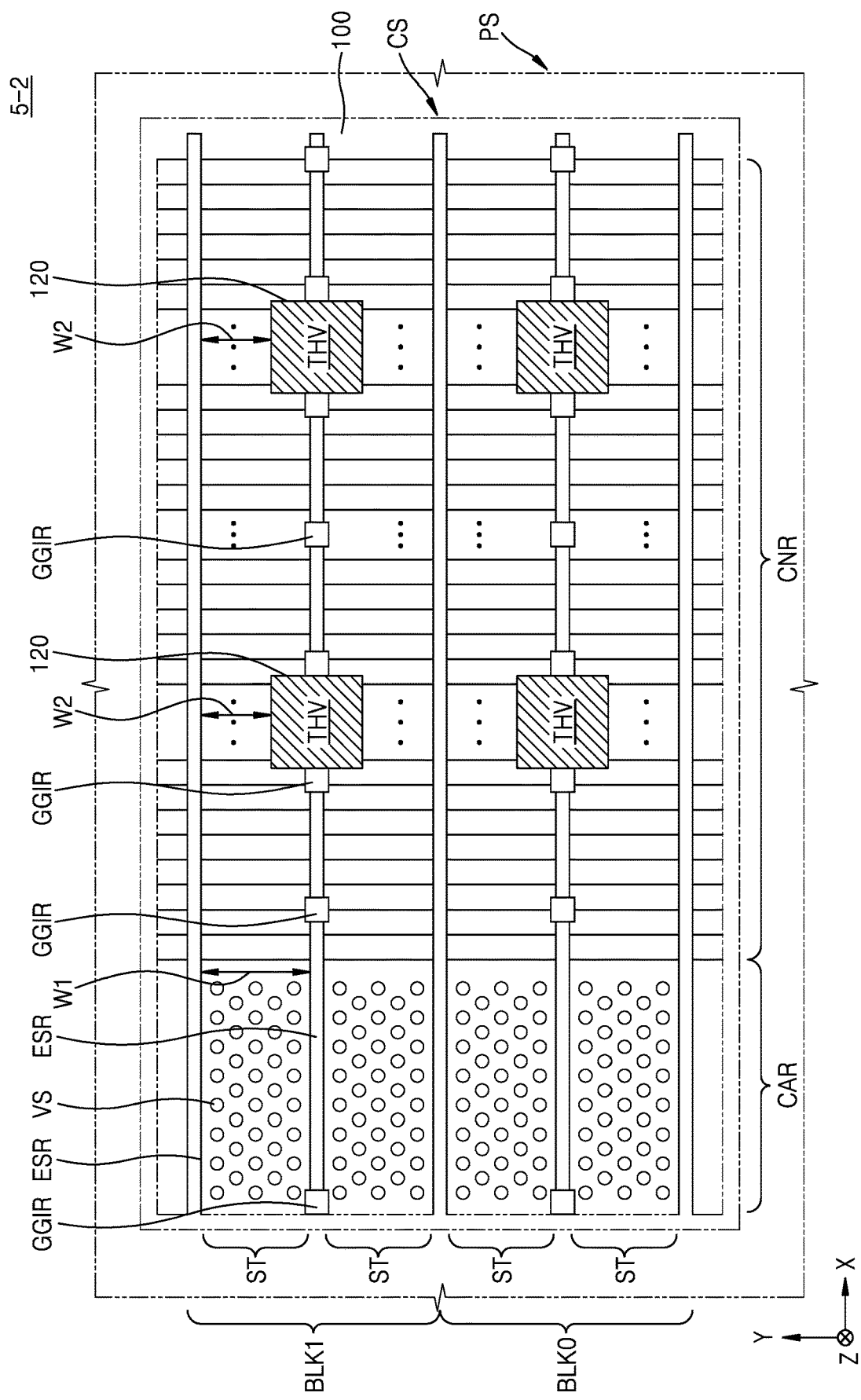
FIG. 5 is a schematic layout diagram illustrating a 3D semiconductor memory device, according to an embodiment of the inventive concept.

FIG. 5 is a schematic layout diagram illustrating a 3D semiconductor memory device 5-2, according to an embodiment of the inventive concept.

The 3D semiconductor memory device 5-2 according to embodiments of the inventive concept is the same as the 3D semiconductor memory device 5-1 of FIG. 4 except that the 3D semiconductor memory device 5-2 includes a plurality of first contact regions 120. In FIG. 5, the same reference numerals as those in FIG. 4 indicate the same members, and thus descriptions thereof may be briefly provided or omitted.

The 3D semiconductor memory device 5-2 may include the plurality of first contact regions 120 in which a pair of electrode structures ST adjacent to each other are spaced apart in the first direction (X direction). The through wiring structures THV may be formed in the first contact regions 120. The first contact regions 120 may be provided between the second wiring portions of the pair of electrode structures ST having the second width W2.

The 3D semiconductor memory device 5-2 may include at least one ground select gate cutting region GGIR that overlaps the electrode separation region ESR and the first contact region 120 on the level of the ground select gate electrodes in a plan view. The ground select gate cutting region GGIR may be formed between the cell array region CAR and the connection region CNR in the first direction. The ground select gate cutting region GGIR may be formed between the first contact regions 120 in the first direction. The ground select gate cutting region GGIR may be in contact with or overlap the first contact region 120 that is in the connection region CNR.

Figure 6:
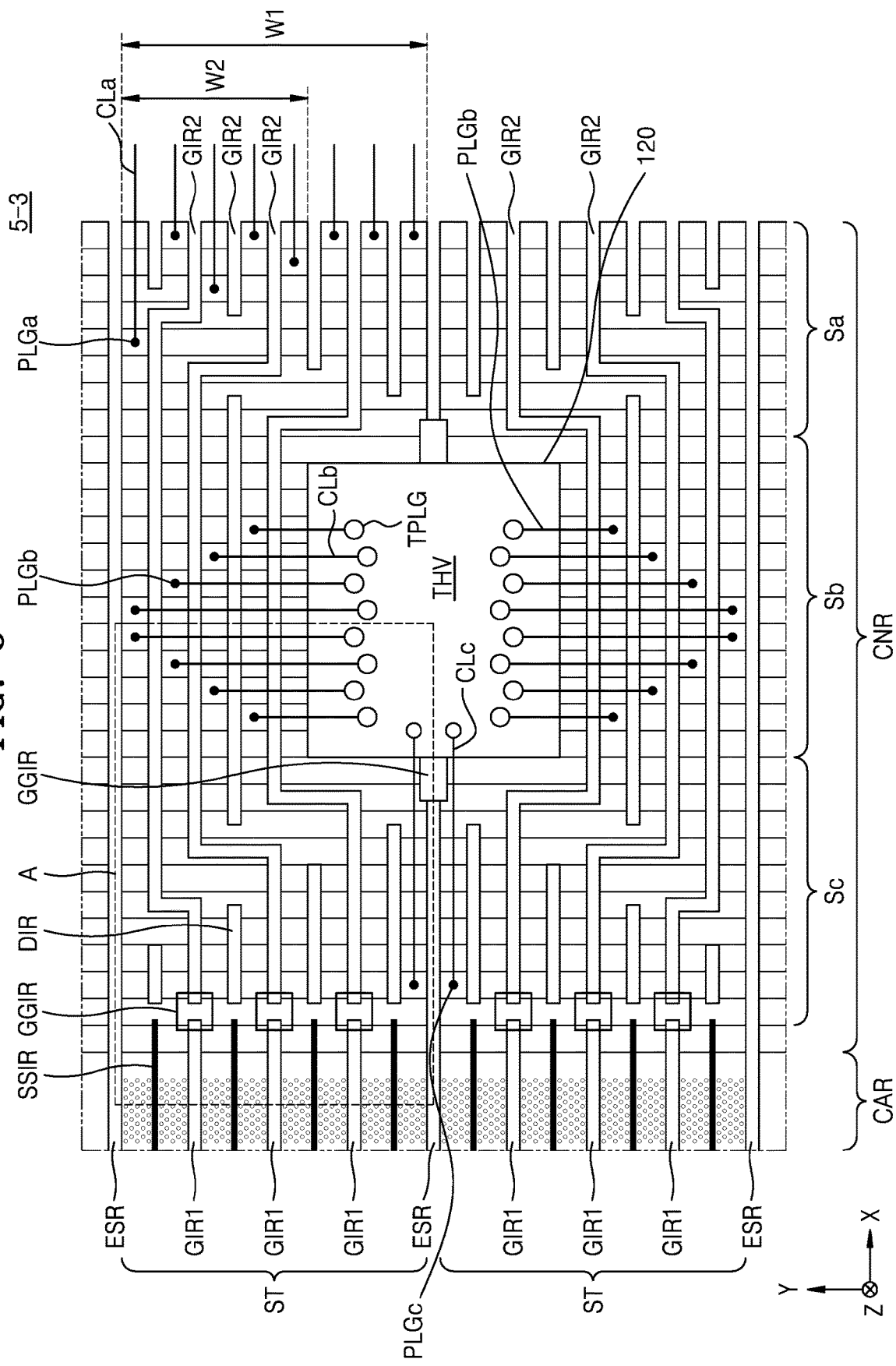
FIG. 6 is a schematic layout diagram illustrating a 3D semiconductor memory device, according to an embodiment of the inventive concept.
Figure 7:
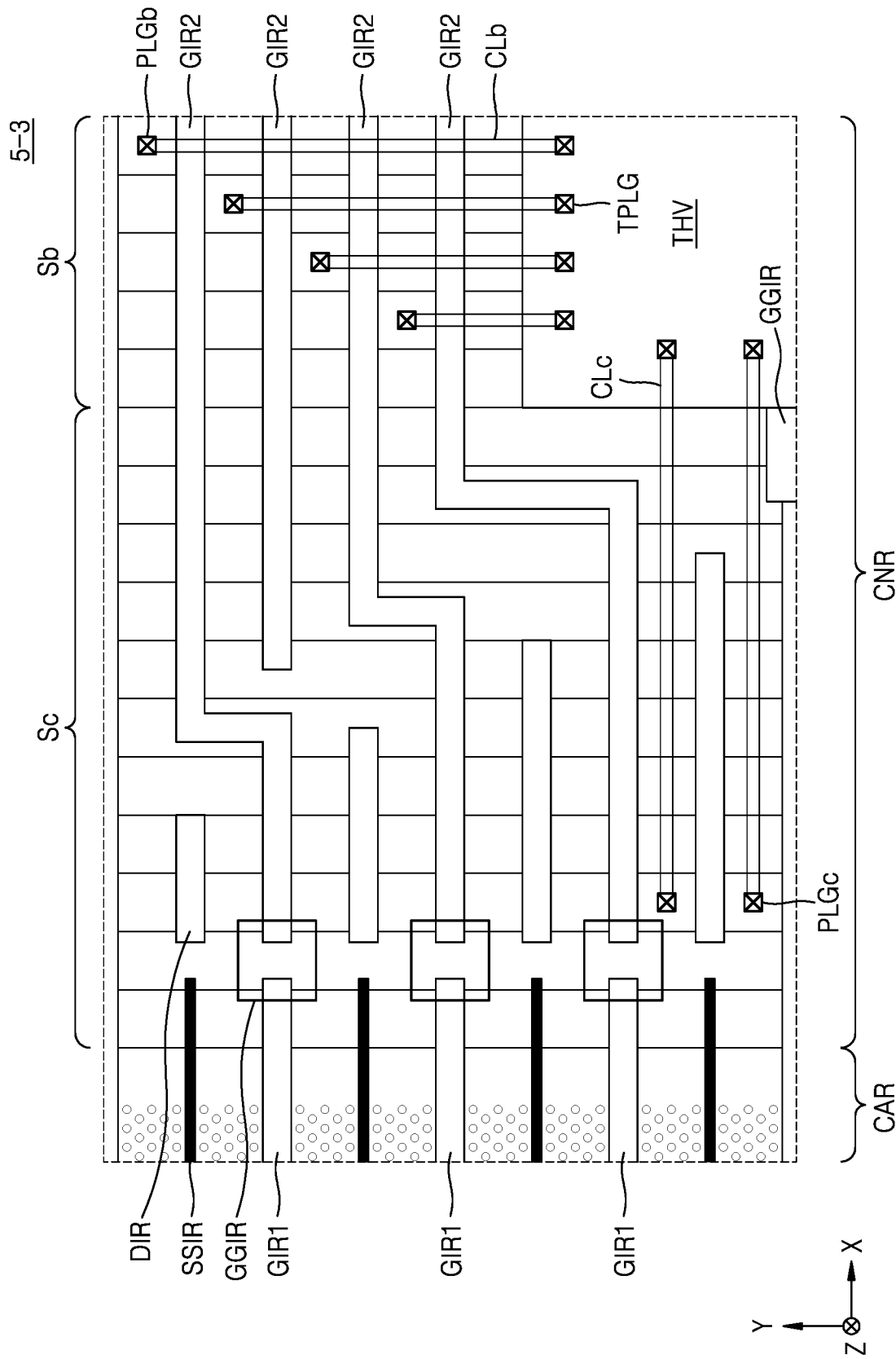
FIG. 7 is an enlarged view of region A in FIG. 6.
Figure 8:
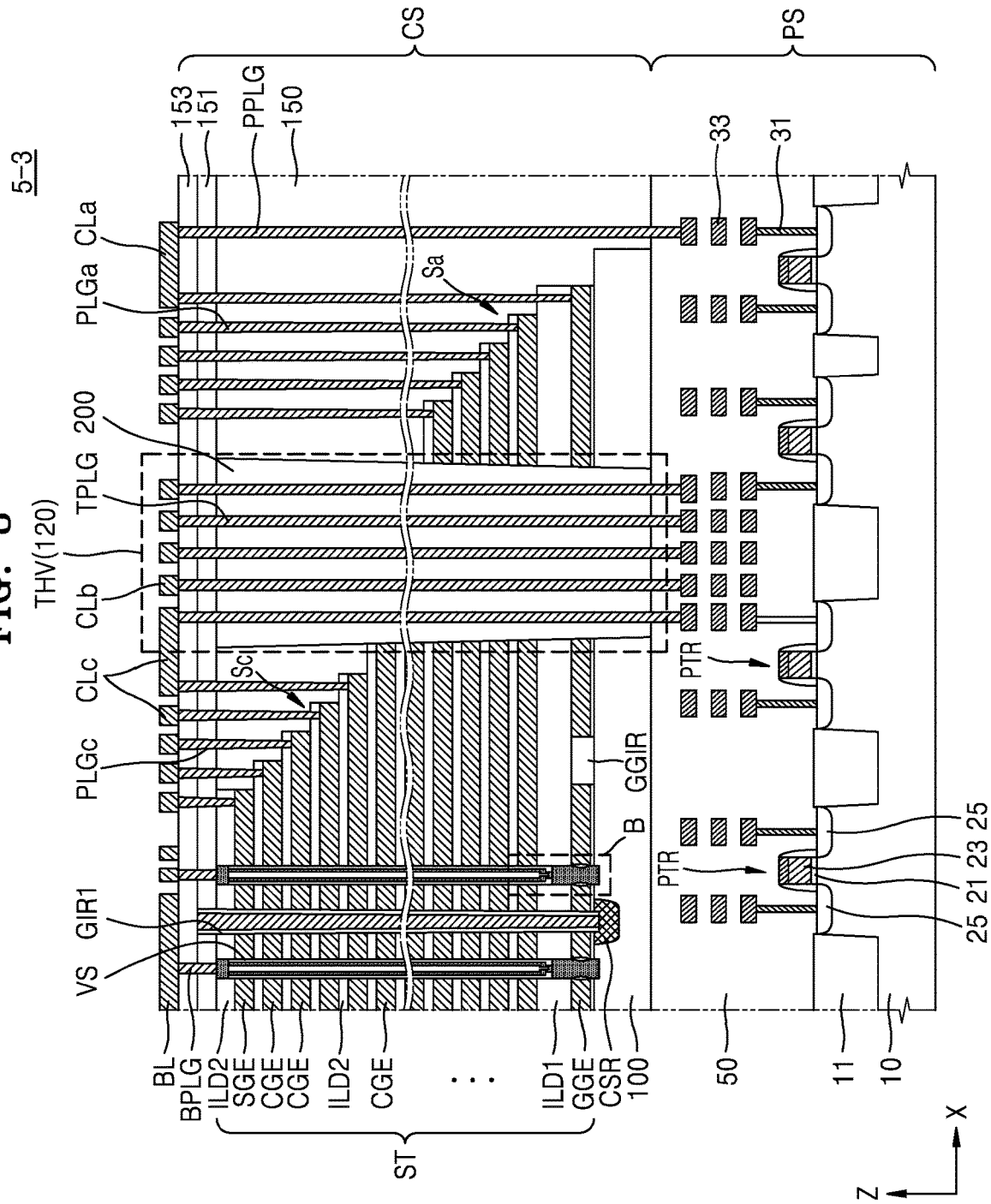
FIG. 8 is a cross-sectional view illustrating a 3D semiconductor memory device, according to an embodiment of the inventive concept.
Figure 9A:
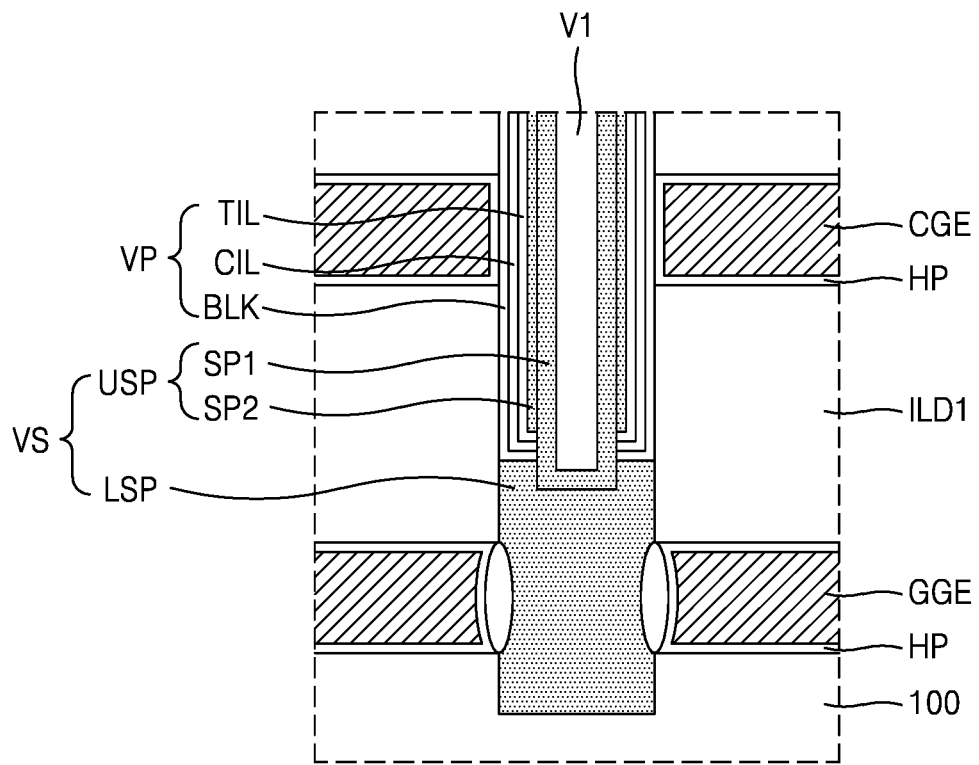
FIGS. 9A and 9B are enlarged views of a region B in FIG. 8, according to embodiments of the inventive concept.
Figure 9B:
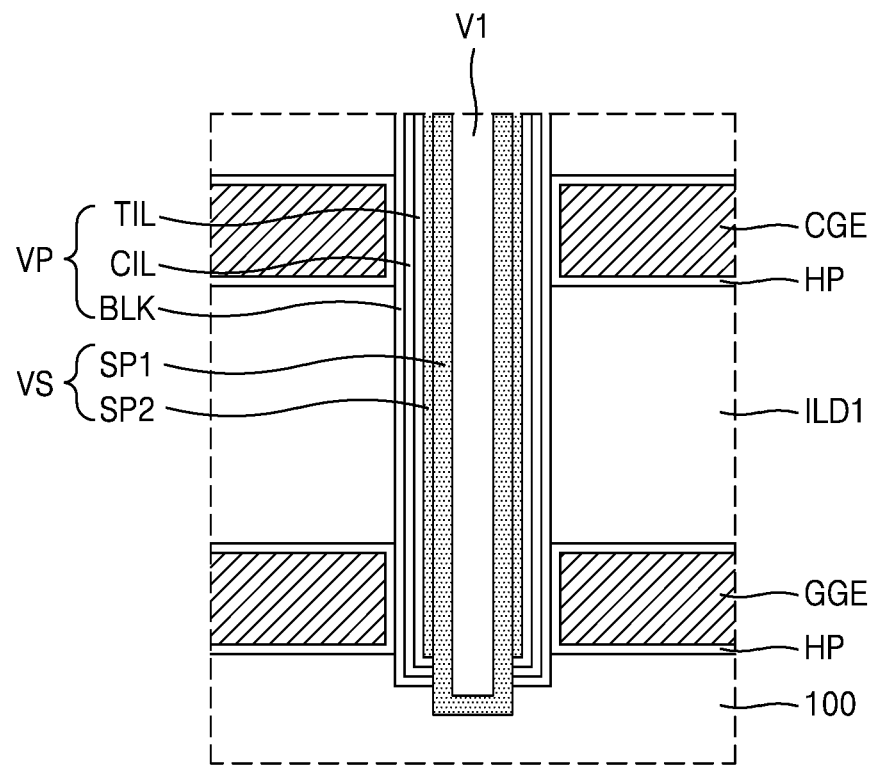
Figure 10:
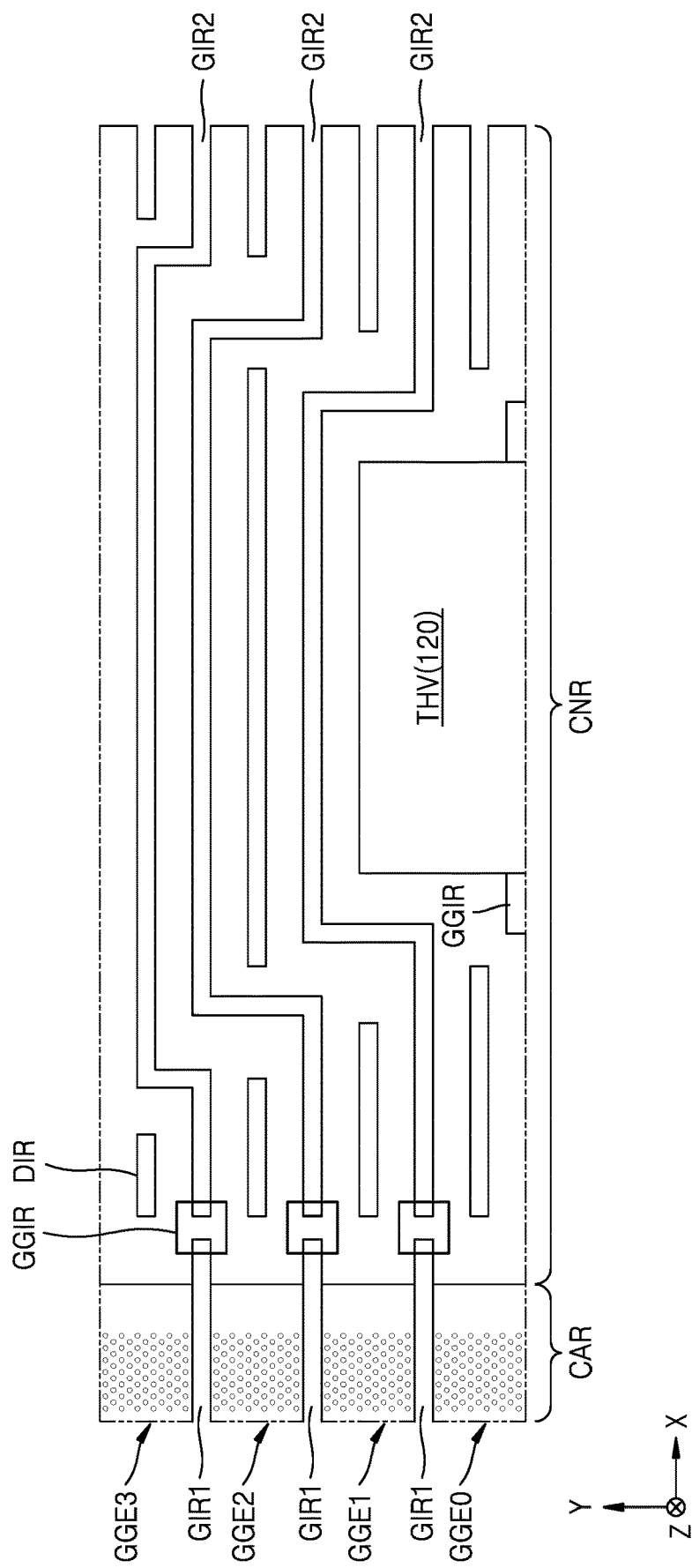
FIG. 10 is a layout diagram schematically illustrating ground select gate electrodes provided in each electrode structure, according to an embodiment of the inventive concept.

FIG. 6 is a schematic layout diagram illustrating a 3D semiconductor memory device 5-3 according to an embodiment of the inventive concept, FIG. 7 is an enlarged view of the region A in FIG. 6, FIG. 8 is a cross-sectional view illustrating the 3D semiconductor memory device 5-3 according to an embodiment of the inventive concept, FIGS. 9A and 9B are enlarged diagrams of the region B in FIG. 8, according to an embodiment of the inventive concept, and FIG. 10 is a layout diagram schematically illustrating the ground select gate electrodes included in each electrode structure, according to an embodiment of the inventive concept.

The 3D semiconductor memory device 5-3 may include two electrode structures ST separated by the electrode separation region ESR as illustrated in FIG. 6. The two electrode structures ST may constitute one memory block. In some embodiments, one electrode structure ST may constitute one memory block. Each of the electrode structures ST may, as to be described later, include a plurality of sub-electrode structures separated into a first gate isolation region GIRL and a second gate isolation region GIR2.

In FIG. 6, each of the electrode structures ST may include three of the first gate isolation regions GIRL and three of the second gate isolation regions GIR2, but may include only one first gate isolation region GIRL and one second gate isolation region GIR2 as needed/desired. When each of the electrode structures ST includes one first gate isolation region GIR1 and one second gate isolation region GIR2, each of the electrode structures ST may include two sub-electrode structures. When one first gate isolation region GIR1 and one second gate isolation region GIR2 are in each of the electrode structures ST, the one first gate isolation region GIR1 and one second gate isolation region GIR2 may be arranged in a linear pattern without being curved or bent in the first direction (X direction). In the following description, description of the electrode structure may be understood as a concept including sub-electrode structures.

The 3D semiconductor memory device 5-3 may include the peripheral logic structure PS as illustrated in FIG. 8. The peripheral logic structure PS may include peripheral logic circuits PTR integrated on a front surface of a semiconductor substrate 10, and a lower buried insulating layer 50 on (e.g., covering) the peripheral logic circuits PTR.

The semiconductor substrate 10 may include a silicon substrate, a silicon-germanium substrate, a germanium substrate, or a single crystal epitaxial layer grown on a single crystal silicon substrate. The peripheral logic circuits PTR may, as described above, include peripheral circuits such as the row decoders, the column decoders, the page buffers, and the control circuits. The peripheral logic circuits PTR may include NMOS transistors and PMOS transistors integrated on the semiconductor substrate 10, low voltage and high voltage transistors, capacitors, resistors, etc.

Activated regions (active regions) may be defined by a device isolation layer 11 formed in the semiconductor substrate 10. Peripheral gate electrodes 23 mounted on the gate insulating layer 21 may be on the semiconductor substrate 10 in the active region. Source/drain regions 25 may be provided on both (e.g., opposite) sides of the peripheral gate electrodes 23 on the semiconductor substrate 10. The peripheral circuit wirings 33 may be electrically connected to the peripheral logic circuits PTR via peripheral circuit contact plugs 31. For example, the peripheral circuit plugs 31 and the peripheral circuit wirings 33 may be connected to the NMOS and PMOS transistors.

The lower buried insulating layer 50 may cover the peripheral logic circuits PTR, the peripheral circuit contact plugs 31, and the peripheral circuit wirings 33 on the semiconductor substrate 10. The lower buried insulating layer 50 may include insulating layers stacked in multiple layers. For example, the lower buried insulating layer 50 may include a silicon oxide layer, a silicon nitride layer, a silicon oxynitride layer, and/or a low-k dielectric layer.

The cell array structure CS may be on the lower buried insulating layer 50 and may include the horizontal semiconductor layer 100, the electrode structures ST, and the vertical structures VS. The horizontal semiconductor layer 100 may include a semiconductor material such as at least one of, for example, silicon (Si), germanium (Ge), silicon germanium (SiGe), gallium arsenide (GaAs), indium gallium arsenide (InGaAs), aluminum gallium arsenide (AlGaAs), and a combination thereof.

In some embodiments, the horizontal semiconductor layer 100 may include a semiconductor doped with an impurity of the first conductivity type and/or an intrinsic semiconductor without being doped with impurities. In some embodiments, the horizontal semiconductor layer 100 may have a crystal structure including at least one of a single crystal structure, an amorphous structure, and a polycrystalline structure. In some embodiments, the horizontal semiconductor layer 100 may include a metallic material. For example, the horizontal semiconductor layer 100 may include tungsten (W), tungsten silicide (WSi), tungsten nitride (WN), cobalt silicide (CoSi), titanium nitride (TiN), etc.

The horizontal semiconductor layer 100 may, as illustrated in FIGS. 6 and 7, include the cell array region CAR and the connection region CNR on one side of the cell array region CAR.

According to some embodiments, the cell strings (CSTR in FIG. 1) may be integrated in the cell array region CAR of the horizontal semiconductor layer 100. The plurality of electrode structures ST may be on the horizontal semiconductor layer 100. The electrode structures ST may, as illustrated in FIGS. 6 and 7, extend in the first direction (X direction) from the cell array region CAR to the connection region CNR and may be spaced apart from each other in the second direction (Y direction) perpendicular to the first direction (X direction).

Each of the electrode structures ST may include a first stacked insulating layer ILD1, a second stacked insulating layer ILD2, a ground select gate electrode GGE, a cell gate electrode CGE, and a string select gate electrode SGE, which are alternately stacked in the third direction (Z direction, that is, a vertical direction) perpendicular to the first and second directions (X and Y directions).

Each of the electrode structures ST may include a plurality of cell gate electrodes CGE that are vertically stacked, a plurality of ground select gate electrodes GGE that are horizontally spaced apart from each other by the ground select gate cutting region GGIR and arranged under the lowermost cell gate electrode CGE, and a plurality of string select gate electrodes SGE that are horizontally spaced apart from each other and arranged on the uppermost cell gate electrode CGE.

In each electrode structure ST, the plurality of ground select gate electrodes GGE may be on the same level as/from a top surface of the horizontal semiconductor layer 100, and the plurality of cell gate electrodes CGE may be at different levels from the top surface of the horizontal semiconductor layer 100.

In each electrode structure ST, the lowermost ground select gate electrodes GGE may be used as the ground select transistors (GST in FIG. 1) controlling an electrical connection between the common source line (CSL in FIG. 1) and the vertical structures VS. The uppermost string select gate electrodes SGE may be used as the gate electrodes of the first and second string select transistors (SST1 and SST2 in FIG. 1) controlling an electrical connection between the zeroth through second bit lines BL0 through BL2 and the vertical structures VS. The cell gate electrodes CGE may be used as control gate electrodes (for example, WL0 through WLn and DWL in FIG. 1) of the memory cells (MCT in FIG. 1).

The plurality of vertical structures VS connected to the zeroth through second bit lines BL0 through BL2 and a bit line contact plug BPLG may penetrate the electrode structure ST in the cell array region CAR and be connected to the horizontal semiconductor layer 100. The vertical structures VS may be arranged in one direction or in a zigzag form in a plan view. The vertical structures VS may include a semiconductor material such as Si, Ge, or a mixture (i.e., combination) thereof.

The vertical structures VS may include a semiconductor doped with impurities or an intrinsic semiconductor without impurities. The vertical structures VS including the semiconductor material may be used as channels of select transistors (for example, SST and GST), the memory cells MCT, and the dummy cell DMC, which are described above with reference to FIG. 1. Here, the vertical structures VS are described in more detail with reference to FIGS. 9A and 9B.

Referring to FIG. 9A, each of the vertical structures VS may include a lower semiconductor pattern LSP and an upper semiconductor pattern USP. The lower semiconductor pattern LSP may be an epitaxial layer grown epitaxially from the horizontal semiconductor layer 100. The lower semiconductor pattern LSP may have a pillar shape filling lower portions of vertical holes. A top surface of the lower semiconductor pattern LSP may be located above a top surface of the lowermost ground select gate electrode GGE. The upper semiconductor pattern USP may be connected to the lower semiconductor pattern LSP and may include Si, Ge, or a mixture thereof.

A bit line conductive pad may be provided on a top end of each of the upper semiconductor patterns USP and may be an impurity region doped with impurities, or may include a conductive material. The upper semiconductor pattern USP may include a first semiconductor pattern SP1 and a second semiconductor pattern SP2. The first semiconductor pattern SP1 may be connected to the lower semiconductor pattern LSP and may be pipe-shaped or macaroni-shaped with a bottom end thereof closed.

The inside of the first semiconductor pattern SP1 of such type may be filled with a buried insulating pattern VI. The first semiconductor pattern SP1 may electrically connect the second semiconductor pattern SP2 to the lower semiconductor pattern LSP. The second semiconductor pattern SP2 may be pipe-shaped or macaroni-shaped, with the top and bottom ends thereof opened. The second semiconductor pattern SP2 may be spaced apart from the lower semiconductor pattern LSP, without being in contact therewith.

As another example, referring to FIG. 9B, each of the vertical structures VS may, like the upper semiconductor pattern SP2 described above, include the first semiconductor pattern SP1 and the second semiconductor pattern SP2. In this case, the first semiconductor pattern SP1 may be in direct contact with the horizontal semiconductor layer 100, and the inside of the first semiconductor pattern SP1 may be filled with the buried insulating pattern VI.

Furthermore, referring to FIGS. 9A and 9B, a vertical insulating pattern VP may be between the electrode structure ST and the vertical structures VS. The vertical insulating pattern VP may be pipe-shaped or macaroni-shaped with top and bottom ends thereof opened. The vertical insulating pattern VP may extend in the third direction (Z direction) and may surround sidewalls of each vertical structure VS. When the vertical structures VS include the lower and upper semiconductor patterns LSP and USP, the vertical insulating pattern VP may surround sidewalls of the upper semiconductor pattern USP.

In embodiments of the inventive concept, the vertical insulating pattern VP may be a portion of a data storage layer. For example, the vertical insulating pattern VP may include, as data storage layers of a NAND flash memory device, a tunnel insulating layer TIL, a charge storage layer CIL, and a blocking insulating layer BLK. For example, the charge storage layer CIL may be an insulating layer including a trap insulating layer, a floating gate electrode, or conductive nano dots.

The horizontal insulating pattern HP may be between one of the side walls of the ground select gate electrodes GGE, the cell gate electrodes CGE, and the string select gate electrodes SGE, and the vertical insulating pattern VP, and may extend to the top and bottom surfaces of each of the ground select gate electrodes GGE, the cell gate electrodes CGE, and the string select gate electrodes SGE. The horizontal insulating pattern HP may include a blocking insulating layer as a portion of the data storage layer of the NAND flash memory device.

Referring to FIGS. 6 through 8 again, in each electrode structure ST, the ground select gate electrodes GGE, the cell gate electrodes CGE, and the string select gate electrodes SGE may be stacked to form a stepped structure in the connection region CNR. Accordingly, a height of each electrode structure ST may decrease away from the cell array region CAR. Lengths in the first direction (X direction) of the ground select gate electrodes GGE, the cell gate electrodes CGE, and the string select gate electrodes SGE of each of the electrode structures ST may be reduced away from the horizontal semiconductor layer 100. In some embodiments, each electrode structure ST may include a lower stepped structure Sa, an intermediate stepped structure Sb, and an upper stepped structure Sc, which are sequentially provided in the first direction (X direction) on the horizontal semiconductor layer 100.

The electrode structure ST may sequentially include a lower region, an intermediate region, and an upper region in the third direction (Z direction) perpendicular to the top surface of the horizontal semiconductor layer 100. The ground select gate electrodes GGE and the cell gate electrodes CGE provided in the lower region of the electrode structure ST may form the lower stepped structure Sa, and the cell gate electrodes CGE provided in the intermediate region of the electrode structure ST may form the intermediate stepped structure Sb. The cell gate electrodes CGE and the string select gate electrodes SGE provided in the upper region of the electrode structure ST may form the upper stepped structure Sc.

As described above with reference to FIGS. 4 and 5, each electrode structure ST may include the first wiring portion having the first width W1 and the second wiring portion having the second width W2. In addition, the pair of electrode structures ST adjacent to each other may be provided with the through wiring structure THV between the second wiring portions thereof. The through wiring structure THV may be included in the first contact region 120.

The through wiring structure THV may include a through insulating pattern 200, that penetrates a portion of the horizontal semiconductor layer 100, extends in the third direction (Z direction), and penetrates some sidewalls of the electrode structures ST, through plugs TLPG provided in the through insulating pattern 200, and a plurality of second conductive lines CLb connected to the through plugs TLPG. In a narrow sense, the through wiring structure THV may include only the through insulating pattern 200 and through plugs TLPG. In some embodiments, the through wiring structure THV may be variously arranged. For example, the through wiring structure THV may be inside the electrode structures ST in the first direction (X direction), not between the electrode structures ST.

The through insulating pattern 200 may extend in the third direction (Z direction) on the lower buried insulating layer 50. The through insulating pattern 200 may include an insulating material such as a silicon oxide layer and a low-k dielectric layer.

In some embodiments, the through insulating pattern 200 may be positioned, in the first direction (X direction), between the lower stepped structure Sa and the upper stepped structure Sc of each electrode structure ST, and in the second direction (Y direction), between the intermediate stepped structures Sb of the pair of electrode structures ST. In other words, the upper stepped structure Sc and the lower stepped structure Sa of each electrode structure ST may be adjacent to the through insulating pattern 200 in the first direction (X direction). The through insulating pattern 200 may use an insulating region that is not substituted with a metal during a manufacturing process.

The through plugs TLPG may penetrate the through insulating pattern 200 and be connected to the peripheral circuit wirings 33 of the peripheral logic structure PS. The through plugs TPLG may be connected to the cell gate electrodes CGE forming the intermediate stepped structure Sb of the electrode structures ST via the conductive lines CLb. Furthermore, the upper buried insulating layer 150 may cover the end portions of the electrode structures ST having a stepped structure and the through insulating pattern 200. A first interlayer insulating layer 151 and a second interlayer insulating layer 153 may be sequentially stacked on the upper buried insulating layer 150, and may be on (e.g., may cover) the top surfaces of the vertical structures VS.

Lower contact plugs PLGa may penetrate the upper buried insulating layer 150 to be provided to the lower region of the electrode structure ST, and may be connected to the ground select gate electrodes GGE and the cell gate electrodes CGE that form the lower stepped structure Sa. The lower contact plugs PLGa may be connected to a connection contact plug PPLG via first conductive lines CLa extending in the first direction (X direction) or the second direction (Y direction). The connection contact plug PPLG may penetrate the upper buried insulating layer 150 and be connected to the peripheral circuit wirings 33 of the peripheral logic structure PS.

Intermediate contact plugs PLGb may penetrate the upper buried insulating layer 150 to be provided to the intermediate region of the electrode structure ST, and may be connected to the electrodes (for example, GGE) that form the intermediate stepped structure Sb. The Intermediate contact plugs PLGb may be connected to the through plug TPLG via second conductive lines CLb extending in the first direction (X direction) or the second direction (Y direction).

Lower contact plugs PLGa may penetrate the upper buried insulating layer 150 to be provided to the upper region of the electrode structure ST, and may be connected to the cell gate electrodes CGE and the string select gate electrodes SGE provided in the upper region of the electrode structure ST. The upper contact plugs PLGc may be connected to the through plug TPLG via third conductive lines CLc extending in the first direction (X direction) or the second direction (Y direction).

According to some embodiments, a first gate isolation regions GIRL penetrating each electrode structure ST in the cell array region CAR and a second gate isolation region GIR2 penetrating each electrode structure ST in the connection region CNR may be provided. The first and second gate isolation regions GIRL and GIR2 may be referred to as isolation regions (or sub-isolation regions) separating the electrode structures ST. According to some embodiments, a string select gate cutting region S SIR isolating the string select gate electrodes may be in the cell array region CAR.

In this case, the first gate isolation regions GIRL may extend in parallel with each other in the first direction (X direction), and the second gate isolation regions GIR2 may extend in parallel with each other in the first direction (X direction). Some of the second gate isolation regions GIR2 may be provided to the second wiring portion having the second width W2 in the electrode structure ST.

The first gate isolation regions GIRL may be spaced apart from the second gate isolation regions GIR2 in the first direction (X direction). In an example, three of the first gate isolation regions GIRL and three of the second gate isolation regions GIR2 are illustrated for each electrode structure ST, but the inventive concept is not limited thereto, and the respective numbers of the first and second gate isolation regions GIRL and GIR2 may vary depending on the degree of integration and process conditions of the 3D semiconductor memory device 5-3.

In the connection region CNR, dummy gate isolation regions DIR penetrating the electrode structures ST may be provided. The dummy gate isolation regions DIR may have a line shape extending in the first direction (X direction), but may be spaced apart from the second gate isolation regions GIR2. The dummy gate isolation regions DIR may be provided in the first wiring portion of the electrode structure ST having the first width W1 in the connection region CNR.

Electrode separation regions ESR may be provided between electrode structures ST adjacent to each other, and one of the electrode separation regions ESR may extend in a straight line in the first direction (X direction) from the cell array region CAR to the connection region CNR. The other one of the electrode separation regions ESR may be bent in the second direction (Y direction) to surround the through insulation pattern 200 from the cell array region CAR and may extend into the connection region CNR.

The ground select gate cutting region GGIR may be between the lowermost ground selection gate electrodes GGE in the second direction (Y direction) in each electrode structure ST, and each of the ground select gate cutting regions GGIR may be between the first gate isolation region GIRL and the second gate isolation region GIR2 in the first direction (X direction).

As described above, as the first and second gate isolation regions GIRL and GIR2 and the ground select gate cutting regions GGIR of the lowest layer are provided in each electrode structure ST, the ground select gate electrodes GGE of the lowermost layer may be spaced apart from each other in the second direction (Y direction) and may be electrically isolated from each other in each electrode structure ST.

Furthermore, common source regions CSR may be provided in the horizontal semiconductor layer 100 under the first gate isolation regions GIRL penetrating the electrode structures ST. The common source regions CSR may extend in parallel with the first gate isolation regions GIRL in the first direction (X direction). The common source regions CSR may include conductive-type impurities opposite to the horizontal semiconductor layer 100, for example, N-type impurities (for example, arsenic (As) or phosphorus (P)).

In some embodiments, the common source regions CSR may not be formed in the horizontal semiconductor layer 100 under the first gate isolation regions GIRL but may be formed to contact the end of the horizontal semiconductor layer 100.

Here, an arrangement of zeroth through third ground gate electrodes GGE0 through GGE3 is described with reference to FIG. 10.

Referring to FIG. 10, when three of the first gate isolation regions GIR1 and three of the second gate isolation regions GIR2 are provided to each of the electrode structures ST, one electrode structure ST may include the zeroth through third ground gate electrodes GGE0 through GGE3.

On levels of the zeroth through third ground gate electrodes GGE0 through GGE3, the zeroth through third ground gate electrodes GGE0 through GGE3 may be electrically isolated by the ground select gate cutting region GGIR. As described above, the ground select gate cutting region GGIR may be formed in at least one of the cell array region CAR and the connection region CNR. The ground select gate cutting region GGIR may be formed between the cell array region CAR and the connection region CNR in the first direction (X direction).

The ground select gate cutting region GGIR may be in contact with or overlap the first contact region 120 that is in the connection region CNR. The ground select gate cutting region GGIR may electrically isolate the ground select gate electrodes GGE from each other, and accordingly, may improve the reliability of the 3D semiconductor memory device 5-3.

Figure 11A:
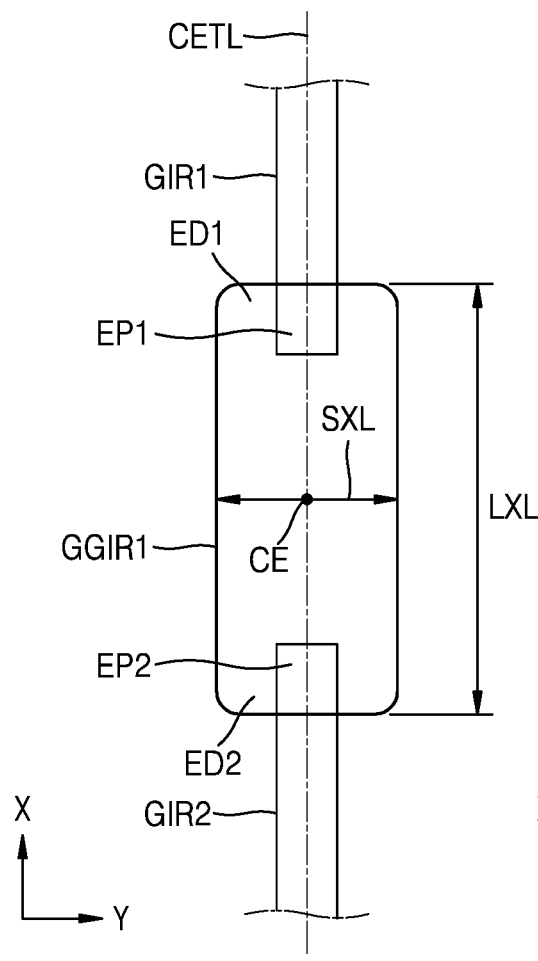
FIGS. 11A-11C illustrate diagrams illustrating planar and vertical overlap relationships between isolation regions and ground select gate cutting regions of a 3D semiconductor memory device, according to an embodiment of the inventive concept.
Figure 11B:
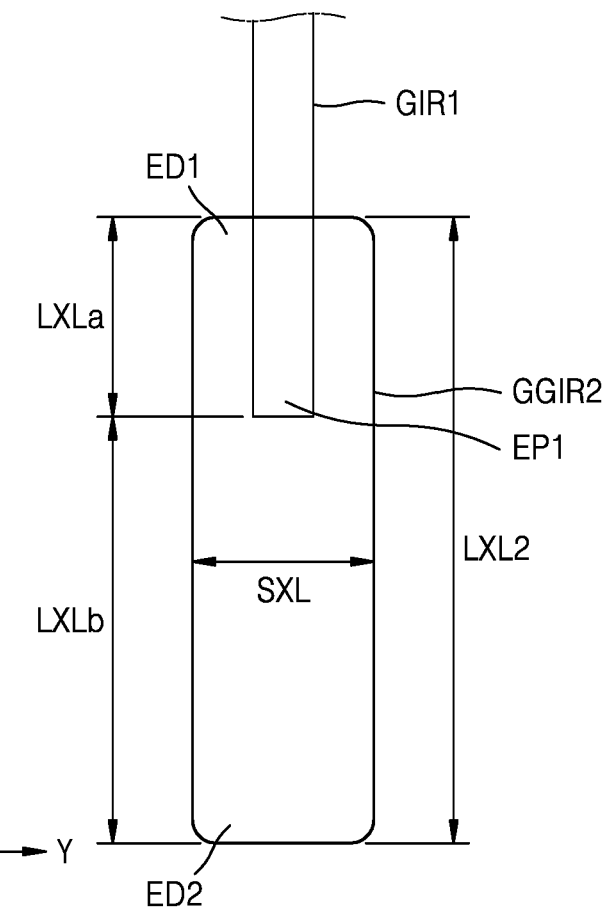
Figure 11C:
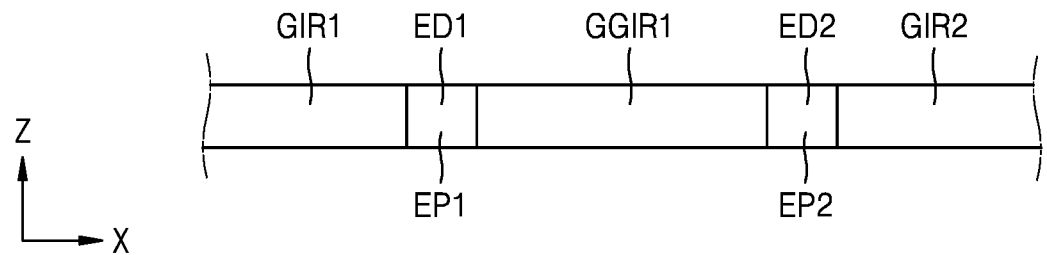

FIGS. 11A-11C illustrate diagrams illustrating planar and vertical overlap relationships between isolation regions and ground select gate cutting regions of a 3D semiconductor memory device, according to embodiments of the inventive concept.

The 3D semiconductor memory device may have a different planar overlap between the first and second gate isolation regions GIR1 and GIR2 and first and second ground select gate cutting regions GGIR1 and GGIR2 according to various layouts on levels of the ground select gate electrodes GGE.

In some embodiments, the 3D semiconductor memory device may include two of the first and second gate isolation regions GIR1 and GIR2 spaced apart from each other in the first direction (X direction) as illustrated in FIG. 11A. FIG. 11C is a cross-sectional view along the center line CETL. As illustrated in FIGS. 11A and 11C, the first gate isolation region GIRL may have a first end portion EP1. The second gate isolation region GIR2 may include a second end portion EP2 opposite to the first end portion EP1.

The first ground select gate cutting region GGIR1 may have a first end portion ED1 and a second end portion ED2. The first ground select gate cutting region GGIR1 may have a length (LXL, or a width) in the first direction (X direction) greater than a length (SXL, or a width) in the second direction (Y direction).

The first ground select gate cutting region GGIR1 may overlap the first and second end portions EP1 and EP2 of the first and second gate isolation regions GIRL and GIR2, respectively. The first and second end portions ED1 and ED2 of the first ground select gate cutting region GGIR1 may overlap the first and second end portions EP1 and EP2 of the first and second gate isolation regions GIRL and GIR2, respectively, in a planar manner (e.g., in a plan view). The length SXL (or the width) in the second direction (Y direction) of the first ground select gate cutting region GGIR1 may be greater than lengths (or widths) in the second direction (Y direction) of the first and second gate isolation regions GIRL and GIR2.

In addition, the first ground select gate cutting region GGIR1 may overlap the first and second gate isolation regions GIRL and GIR2 such that the center line CETL passing through a center point CE coincides with the center line CETL of the first and second gate isolation regions GIRL and GIR2 in the first direction (X direction). In some embodiments, the first ground select gate cutting region GGIR1 may overlap the first and second gate isolation regions GIRL and GIR2 such that the center line CETL passing through a center point CE does not coincide with the center line CETL of the first and second gate isolation regions GIRL and GIR2 in the first direction (X direction).

In some embodiments, the width (or the length) in the second direction (Y direction) of any one of the first and second gate isolation regions GIRL and GIR2, for example, the first gate isolation region GIRL may be identical to or less than the width (SXL, or the length) of the first ground select gate cutting region GGIR1.

In some embodiments, the 3D semiconductor memory device may include one of the first gate isolation region GIRL extending in the first direction (X direction) as illustrated in FIG. 11B. The first gate isolation region GIRL may include the first end portion EP1.

The second ground select gate cutting region GGIR2 may include the first end portion ED1. In the first second ground select gate cutting region GGIR2, a length LXL2 in the first direction (X direction) may be greater than the length SXL in the Y direction. In the second ground select gate cutting region GGIR2, the length LXL2 in the first direction (X direction) may be a sum of a first length LXLa and a second length LXLb. The first length LXLa may be less than or equal to the second length LXLb.

The second ground select gate cutting region GGIR2 may overlap the first end portion EP1 of the first isolation region GIRL in a planar manner. The first end portion ED1 of the second ground select gate cutting region GGIR2 may overlap the first end portion EP1 of the first gate isolation region GIR1. The second ground select gate cutting region GGIR2 may include the first length LXLa overlapping the first end portion EP1 of the first gate isolation region GIRL in a planar manner, and the second length LXLb not overlapping the first end portion EP1 of the first gate isolation region GIRL in a planar manner.

In FIGS. 11A through 11C, the isolation regions illustrate the first and second gate isolation regions GIRL and GIR2 as examples, but the first and second isolation regions GIRL and GIR2 may include (e.g., may be part of) electrode separation regions ESR.

FIGS. 12A and 12B are layout diagrams illustrating a planar overlap relationship between an isolation region, a first contact region, and a ground select gate cutting region of a 3D semiconductor memory device, according to an embodiment of the inventive concept;

The 3D semiconductor memory device may have a different planar overlap between the first and second gate isolation regions GIRL and GIR2, the first contact regions 120 including the through wiring structure THV, and the first and second ground select gate cutting regions GGIR1 and GGIR2 according to various layouts on levels of the ground select gate electrodes GGE.

In some embodiments, the 3D semiconductor memory device may include a third ground select gate cutting region GGIR3 extending in the first direction (X direction) as illustrated in FIG. 12A. The first gate isolation region GIRL may include the first end portion EP1.

The third ground select gate cutting region GGIR3 may include the first end portion ED1 and the second end portion ED2. In the third ground select gate cutting region GGIR3, the length LXL2 in the first direction (X direction) may be greater than the length SXL in the Y direction. In the third ground select gate cutting region GGIR3, the length LXL2 in the first direction (X direction) may be a sum of the first length LXLa and the second length LXLb.

The third ground select gate cutting region GGIR3 may overlap the first end portion EP1 of the first gate isolation region GIR1 in a planar manner. The second end portion ED2 of the first ground select gate cutting region GGIR1 may overlap the first contact region 120 in a planar manner.

In some embodiments, the 3D semiconductor memory device may, as illustrated in FIG. 12B, include the first gate isolation region GIR1 extending in the first direction (X direction), and the second gate isolation region GIR2 extending in the first direction (X direction) and being spaced apart from the first gate isolation region GIR1 in the second direction (Y direction). The first and second gate isolation regions GIR1 and GIR2 may include the first and second end portions EP1 and EP2, respectively.

The fourth ground select gate cutting region GGIR4 may be arranged in the second direction (Y direction), and include the first and second end portions ED1 and ED2. In the fourth ground select gate cutting region GGIR4, the length LXL2 in the second direction (Y direction) may be greater than the length SXL in the first direction (X direction).

The fourth ground select gate cutting region GGIR4 may overlap the first and second end portions EP1 and EP2 of the first and second gate isolation regions GIR1 and GIR2, respectively, in a planar manner. The first end portion ED1 and the second end portion ED2 of the fourth ground select gate cutting region GGIR4 may overlap the second end portion EP2 of the second gate isolation region GIR2 and the first end portion of the first gate isolation region GIRL respectively, in a planar manner.

In FIGS. 12A and 12B, the isolation regions illustrate the first and second gate isolation regions GIR1 and GIR2 as examples, but the first and second isolation regions GIR1 and GIR2 may include (e.g., may be part of) the electrode separation regions ESR.

Figure 13:
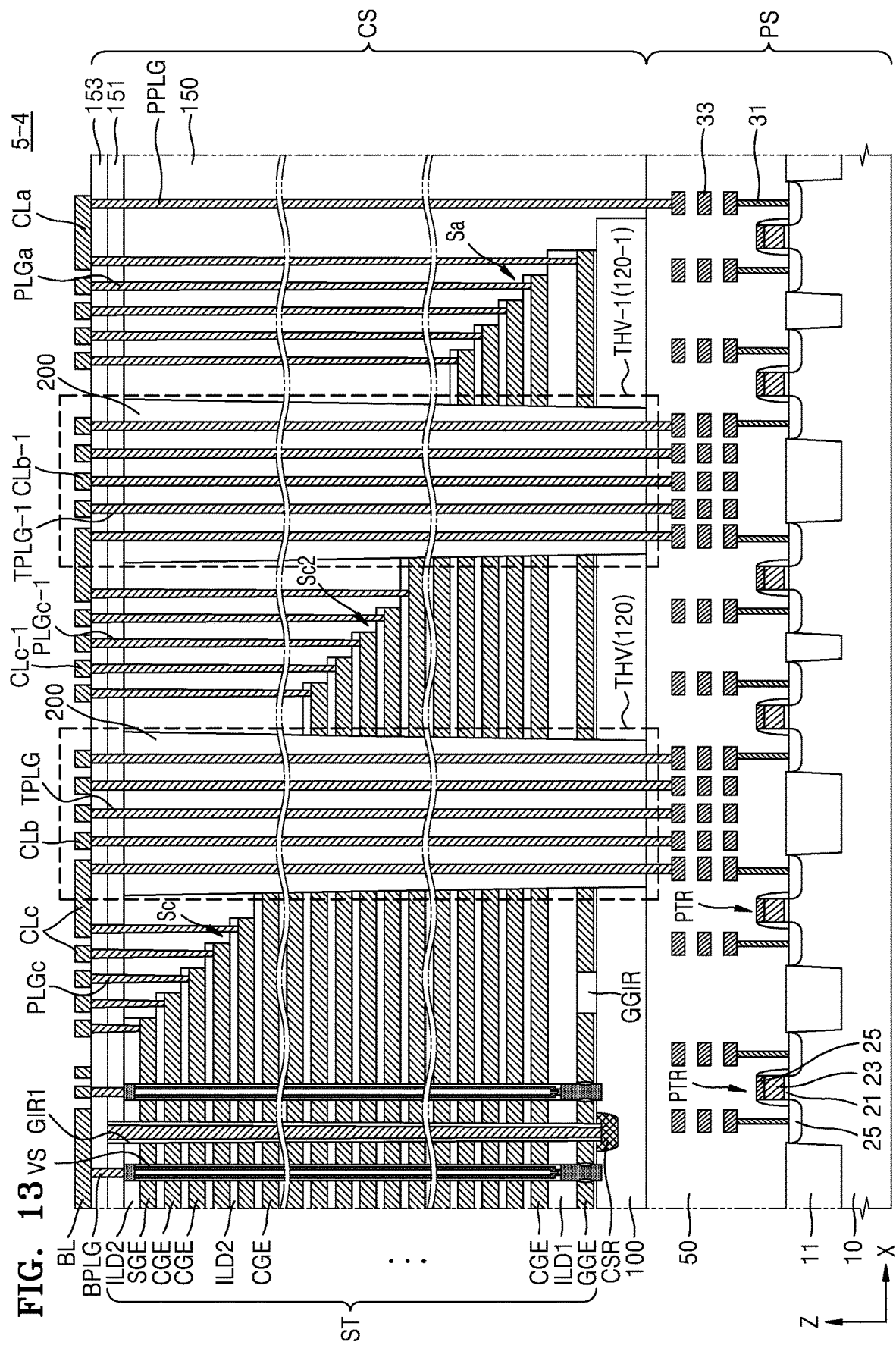
FIG. 13 is a cross-sectional view illustrating a 3D semiconductor memory device, according to an embodiment of the inventive concept.

FIG. 13 is a cross-sectional view illustrating a 3D semiconductor memory device 5-4, according to an embodiment of the inventive concept.

When compared to the 3D semiconductor memory device 5-3 of FIGS. 5 through 10, the 3D semiconductor memory device 5-4 may be almost the same as the 3D semiconductor memory device 5-3, except that the 3D semiconductor memory device 5-4 includes two first contact regions 120 and 120-1. In the description with reference to FIG. 13, the same contents as those described with reference to FIGS. 5 through 10 may be briefly explained or omitted.

The 3D semiconductor memory device 5-4 may include a first contact region 120 including a first through wiring structure THV and a second contact region 120-1 including a second through wiring structure THV-1. The first and second contact regions 120 and 120-1 may be spaced apart from each other.

The first through wiring structure THV may include a through insulating pattern 200, which penetrates a portion of the horizontal semiconductor layer 100, extends in the third direction (Z direction), and penetrates some sidewalls of the electrode structures ST, through plugs TLPG provided in the through insulating pattern 200, and a plurality of second conductive lines CLb connected to the through plugs TLPG.

The second through wiring structure THV-1 may include a through insulating pattern 200, which penetrates a portion of the horizontal semiconductor layer 100, extends in the third direction (Z direction), and penetrates some sidewalls of the electrode structures ST, through plugs TLPG-1 provided in the through insulating pattern 200, and a plurality of second conductive lines CLb-1 connected to the through plugs TLPG-1.

Second upper contact plugs PLGc-1 may be between the first contact region 120 and the second contact region 120-1. The second upper contact plugs PLGc-1 may penetrate the upper buried insulating layer 150 to be provided to the second upper region of the electrode structure ST and may be connected to the ground select gate electrodes GGE forming a second upper stepped structure Sc2. Second upper contact plugs PLGc-1 may be connected to the through plugs TPLG-1 via a fourth conductive line CLc-1.

The first contact region 120 and the second contact region 120-1 may use an insulating region that is not substituted with metal in the manufacturing process. In some embodiments, the common source region CSR may not be formed in the horizontal semiconductor layer 100 under the first gate isolation regions GIRL but may be formed to contact the end of the horizontal semiconductor layer 100.

Figure 14:
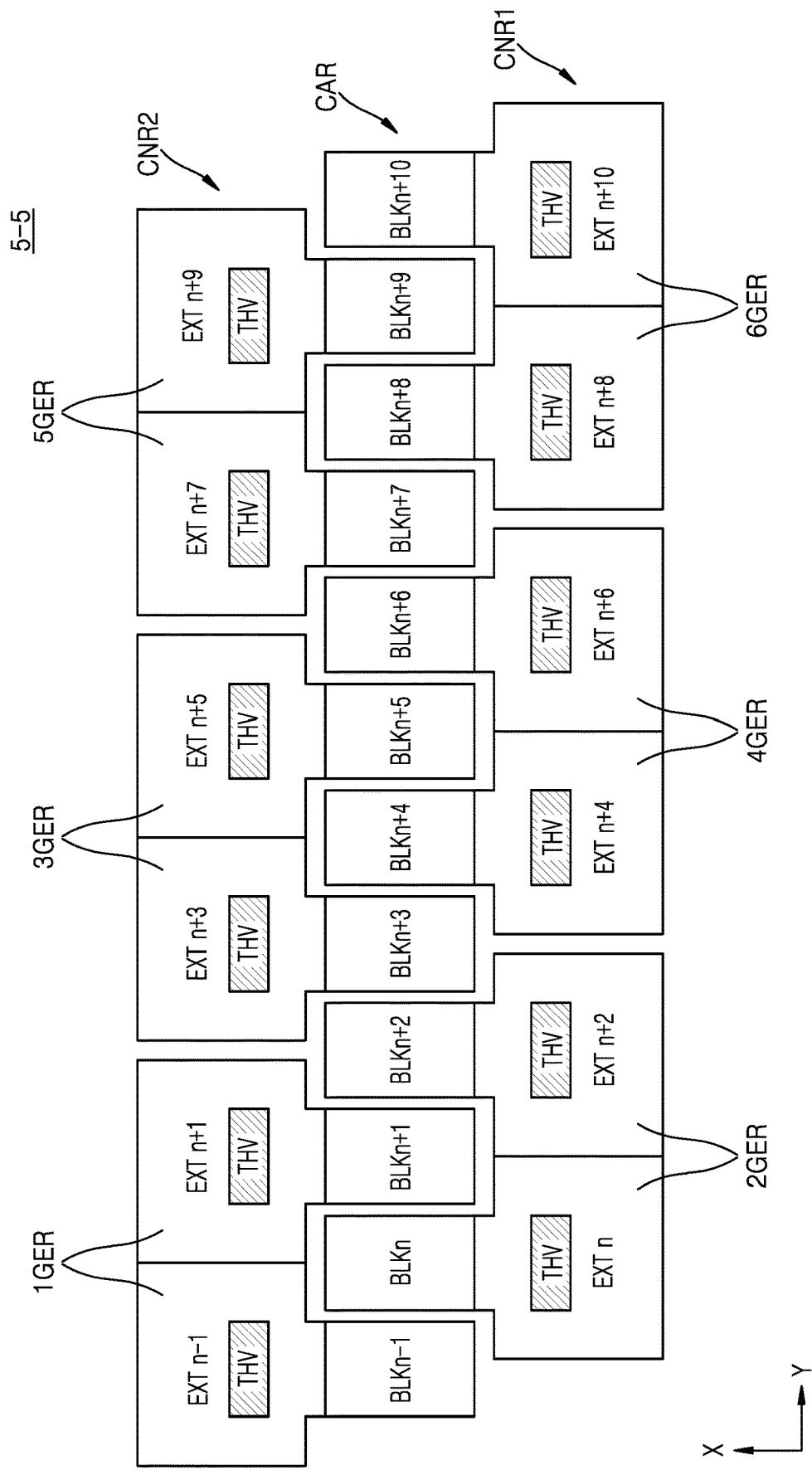
FIG. 14 is a block diagram illustrating an arrangement relationship between a cell array region and a connection region of a 3D semiconductor memory device, according to an embodiment of the inventive concept.

FIG. 14 is a block diagram illustrating an arrangement relationship between the cell array region CAR and the connection region CNR of the 3D semiconductor memory device 5-5, according to an embodiment of the present invention.

The 3D semiconductor memory device 5-5 according to an embodiment of the inventive concept may include the cell array region CAR, and a first connection region CNR1 and a second connection region CNR2 electrically connected to the cell array region CAR as described above.

The cell array region CAR may include $(n-1)^{th}$ through $(n+10)^{th}$ memory blocks BLKn-1 through BLKn+10 (where n is a positive integer of 1 or more) in the second direction (Y direction). Twelve memory blocks ($(n-1)^{th}$ through $(n+10)^{th}$ memory blocks BLKn-1 through BLKn+10) are illustrated, but are only examples. The first and second connection regions CNR1 and CNR2 may include $(n-1)^{th}$ through $(n+10)^{th}$ extension blocks EXTn-1 through EXTn+10 including the through wiring structures THV. Twelve extension blocks ($(n-1)^{th}$ through $(n+10)^{th}$ extension blocks EXTn-1 through EXTn+10) are illustrated, but are only examples.

The first connection region CNR1 may be arranged in the first direction (X direction) on one side of first memory blocks (BLKn, BLKn+2, BLKn+4, BLKn+6, BLKn+8, and BLKn+10) that are even numbered memory blocks among the $(n-1)^{th}$ through $(n+10)^{th}$ memory blocks BLKn-1 through BLKn+10 in the second direction (Y direction). The first connection region CNR1 may include a second sub-extension region group 2GER, a fourth sub-extension region group 4GER, and a sixth sub-extension region group 6GER. The second, fourth, and sixth sub-extension region groups 2GER, 4GER, and 6GER may be regions that are adjacent to each other in the first connection region CNR1 and respectively include one memory block therebetween in the second direction (Y direction).

The second sub-extension region group 2GER may include $n^{th}$ and $(n+2)^{th}$ extension blocks EXTn and EXTn+2 respectively connected to the $n^{th}$ and $(n+2)^{th}$ memory blocks BLKn and BLKn+2. The fourth sub-extension region group 4GER may include $(n+4)^{th}$ and $(n+6)^{th}$ extension blocks EXTn+4 and EXTn+6 respectively connected to the $(n+4)^{th}$ and $(n+6)^{th}$ memory blocks BLKn+4 and BLKn+6. The sixth sub-extension region group 6GER may include $(n+8)^{th}$ and $(n+10)^{th}$ extension blocks EXTn+8 and EXTn+10 respectively connected to the $(n+8)^{th}$ and $(n+10)^{th}$ memory blocks BLKn+8 and BLKn+10.

The second connection region CNR2 may be arranged in the first direction (X direction) on one side of second memory blocks (BLKn-1, BLKn+1, BLKn+3, BLKn+5, BLKn+7, and BLKn+9) that are odd numbered memory blocks among the $(n-1)^{th}$ through $(n+10)^{th}$ memory blocks BLKn-1 through BLKn+10 in the second direction. The second connection region CNR2 may include a first sub-extension region group 1GER, a third sub-extension region group 3GER, and a fifth sub-extension region group 5GER. The first, third, and fifth sub-extension region groups 1GER, 3GER, and 5GER may be regions that are adjacent to each other in the second connection region CNR2 and respectively include one memory block therebetween in the second direction (Y direction).

The first sub-extension region group 1GER may include $(n-1)^{th}$ and $(n+1)^{th}$ extension blocks EXTn-1 and EXTn+1 respectively connected to the $(n-1)^{th}$ and $(n+1)^{th}$ memory blocks BLKn-1 and BLKn+1. The third sub-extension region group 3GER may include $(n+3)^{th}$ and $(n+5)^{th}$ extension blocks EXTn+3 and EXTn+5 respectively connected to the $(n+3)^{th}$ and $(n+5)^{th}$ memory blocks BLKn+3 and BLKn+5. The fifth sub-extension region group 5GER may include $(n+7)^{th}$ and (n+9) t extension blocks EXTn+7 and EXTn+9 respectively connected to the $(n+7)^{th}$ and $(n+9)^{th}$ memory blocks BLKn+7 and BLKn+9. The 3D semiconductor memory device 5-5 described above may increase the degree of integration by efficiently arranging the $(n-1)^{th}$ through $(n+10)^{th}$ memory blocks BLKn-1 through BLKn+10 and the (n−1)$^{th}$ through (n+10)$^{th}$ connection blocks EXTn−1 through EXTn+10 within a unit area. In particular, each pair of memory blocks BLK in a respective sub-extension region group may have another memory block (of a different sub-extension region group) extending therebetween.

Figure 15:
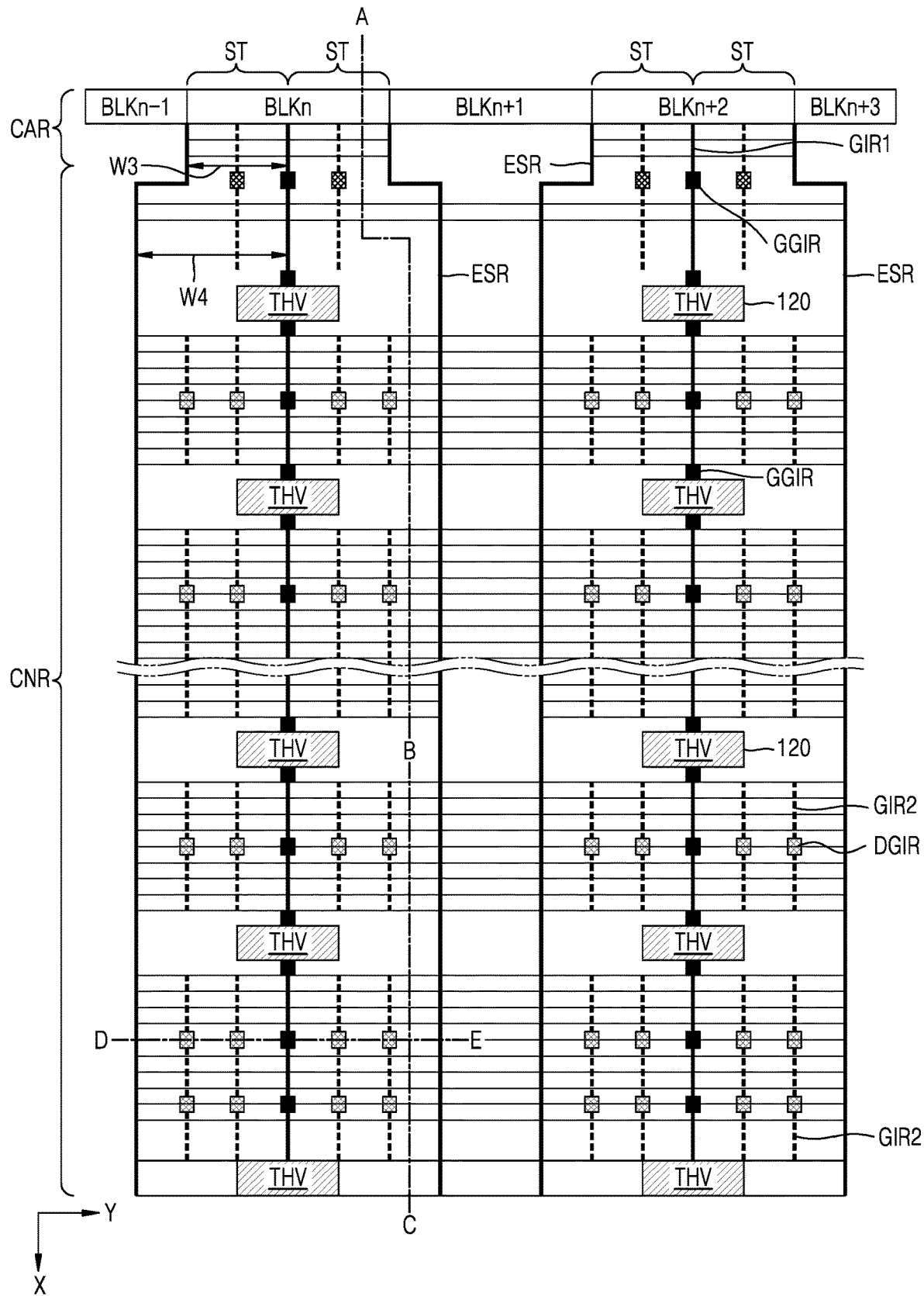
FIG. 15 is a schematic layout diagram illustrating a 3D semiconductor memory device, according to an embodiment of the inventive concept.
Figure 16:
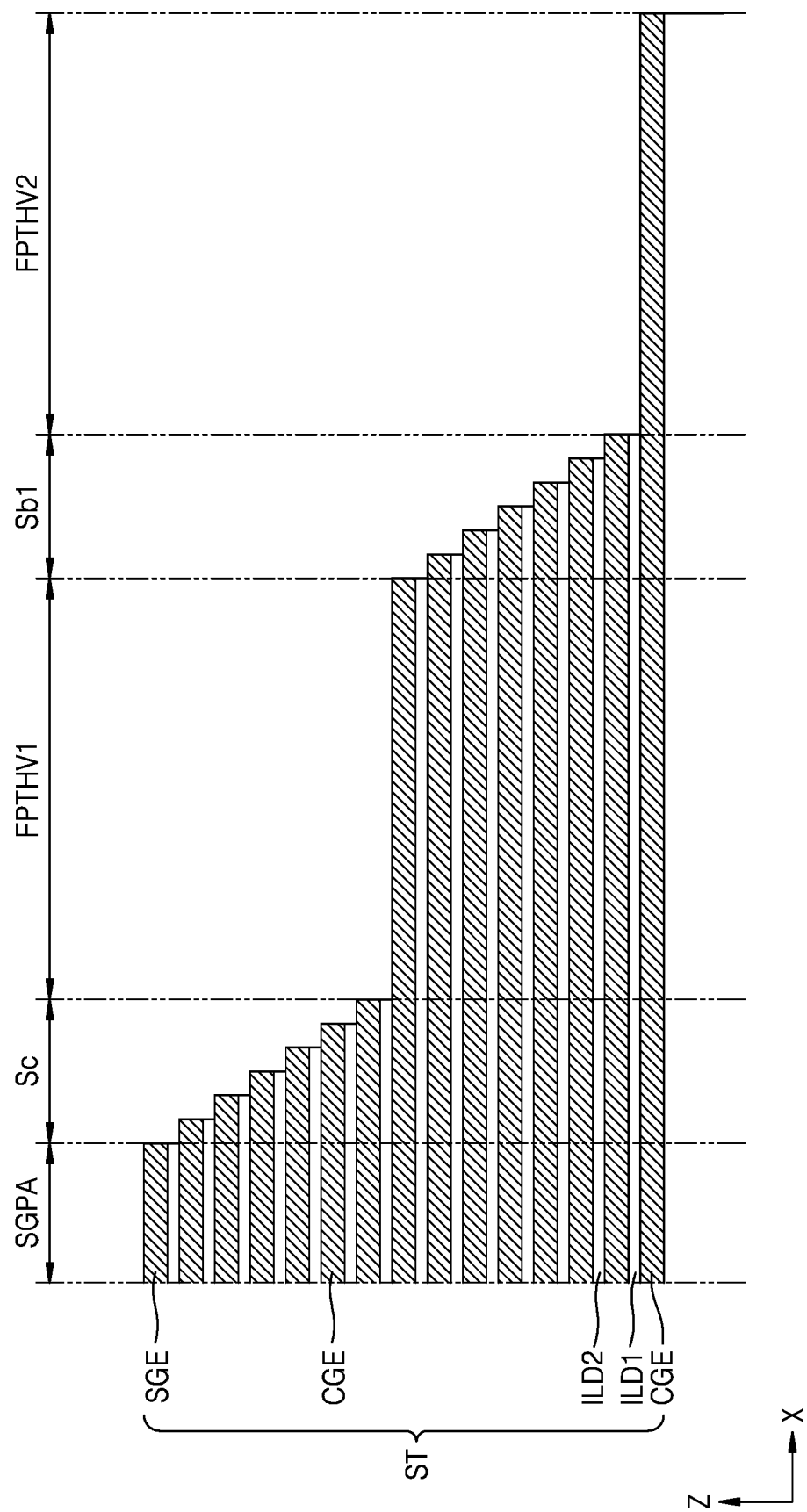
FIG. 16 is a cross-sectional view taken along line A-B in FIG. 15.
Figure 17:
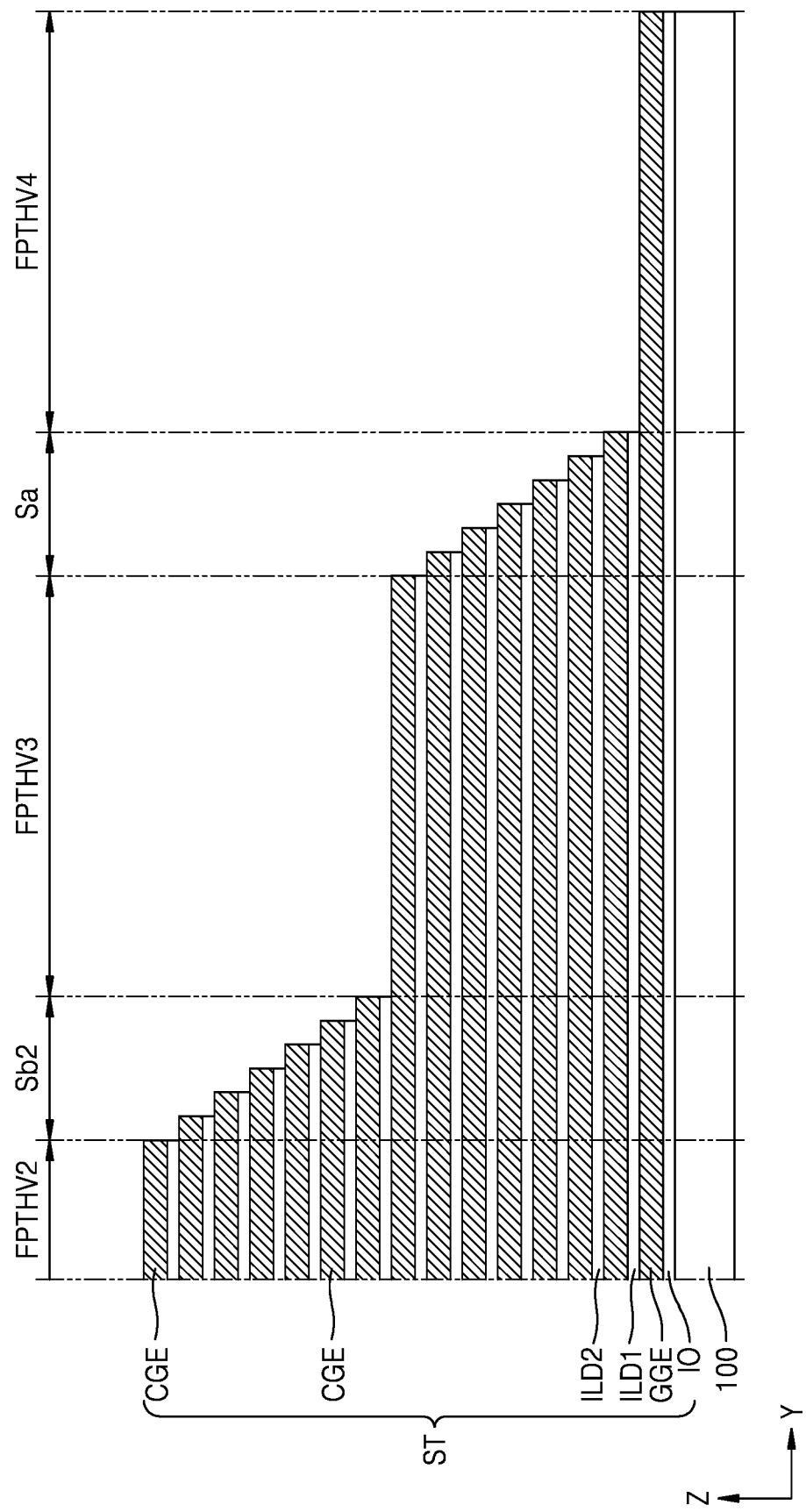
FIG. 17 is a cross-sectional view taken along line B-C in FIG. 15.
Figure 18:
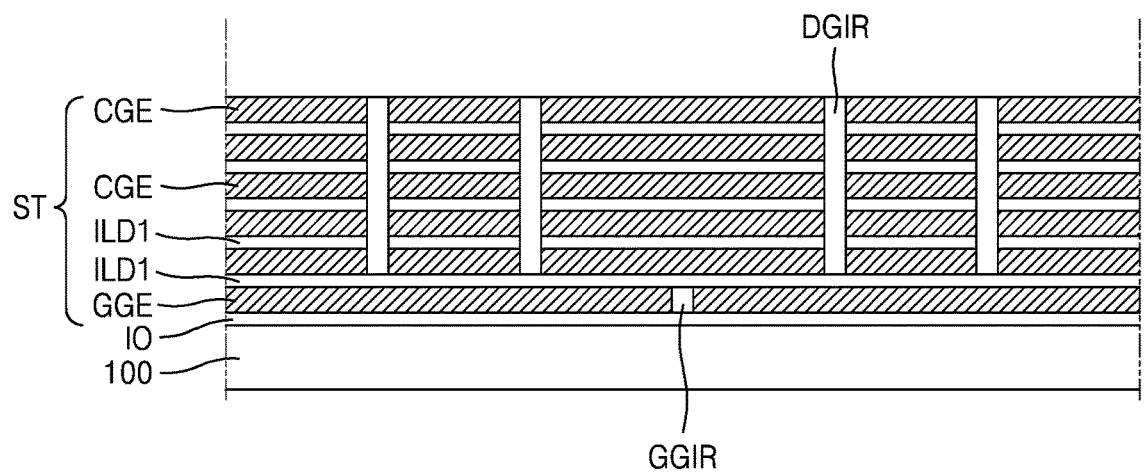
FIG. 18 is a cross-sectional view taken along line D-E in FIG. 15.

FIG. 15 is a schematic layout diagram illustrating the 3D semiconductor memory device 5-5 according to an embodiment of the inventive concept, FIG. 16 is a cross-sectional view taken along line A-B in FIG. 15, FIG. 17 is a cross-sectional view taken along line B-C in FIG. 15, and FIG. 18 is a cross-sectional view taken along line D-E in FIG. 15.

The 3D semiconductor memory device 5-5 may be an embodiment to which an arrangement relationship between the cell array region CAR and the connection region CNR in FIG. 14 is applied. In FIG. 15, only the connection region CNR located on one side of the cell array region CAR is illustrated for convenience. The 3D semiconductor memory device 5-5 may include the cell array region CAR including the (11-1)$^{th}$, n$^{th}$, (n+1)$^{th}$, (n+2)$^{th}$, and (n+3)$^{th}$ memory blocks BLKn−1, BLKn, BLKn+1, BLKn+2, and BLKn+3 and the connection region CNR connected to the n$^{th}$ and (n+2)$^{th}$ memory blocks BLKn and BLKn+2.

As illustrated in FIGS. 16 through 18, each of the electrode structures ST may include first insulating layers ILD1 and second insulating layers ILD2 and the ground select gate electrodes GGE, the cell gate electrodes CGE, and the string select gate electrodes SGE, which are alternately stacked in the third direction (Z direction; that is, the vertical direction) perpendicular to the first and second directions (X and Y directions).

Each of the electrode structures ST may include the plurality of cell gate electrodes CGE that are vertically stacked, the plurality of ground select gate electrodes GGE that are horizontally spaced apart from each other by the ground select gate cutting region GGIR and arranged under the lowermost cell gate electrode CGE, and the plurality of string select gate electrodes SGE that are horizontally spaced apart from each other and arranged on the uppermost cell gate electrode CGE.

In each electrode structure ST, as described above, the plurality of ground select gate electrodes GGE may be on the same level as/from a top surface of the horizontal semiconductor layer 100, and the plurality of cell gate electrodes CGE may be at different levels from the top surface of the horizontal semiconductor layer 100. An initial insulating layer IO may be formed on the horizontal semiconductor layer 100 as needed/desired.

Referring to FIGS. 16 and 17, in each electrode structure ST, the ground select gate electrodes GGE, the cell gate electrodes CGE, and the string select gate electrodes SGE may be stacked to form a stepped structure in the connection region CNR. Accordingly, a height of each electrode structure ST may decrease away from the cell array region CAR. Lengths in the first direction (X direction) of the ground select gate electrodes GGE, the cell gate electrodes CGE, and the string select gate electrodes SGE of each of the electrode structures ST may be reduced away from the horizontal semiconductor layer 100.

In some embodiments, each electrode structure ST may include a lower stepped structure Sa, an intermediate stepped structure Sb, a second intermediate stepped structure Sb2, a first intermediate stepped structure Sb1, and the upper stepped structure Sc, which are sequentially provided in the first direction (X direction) on the horizontal semiconductor layer 100.

The electrode structure ST may sequentially include a lower region, an intermediate region, and an upper region in the third direction (Z direction) perpendicular to the top surface of the horizontal semiconductor layer 100. The cell gate electrodes CGE and the ground select gate electrodes GGE provided in the lower region of the electrode structure ST may form the lower stepped structure Sa. The cell gate electrodes CGE provided in the intermediate region of the electrode structure ST may form the second and first intermediate stepped structures Sb2 and Sb1. The cell gate electrodes CGE and the string select gate electrodes SGE provided in the upper region of each of the electrode structures ST may form the upper stepped structure Sc. The electrode structure ST may include a fourth planarized region FPTHV4, a third planarized region FPTHV3, a second planarized region FPTHV2, a first planarized region FPTHV1, and a selection gate planarized region SGPA. In the fourth planarized region FPTHV4, the third planarized region FPTHV3, the second planarized region FPTHV2, the first planarized region FPTHV1, and the selection gate planarized region SGPA, the string select gate electrode SGE, the cell gate electrode CGE, and the ground select gate electrode GGE may have surfaces thereof exposed and thus may function as a string select line pad, a word line pad, and a ground select line pad, respectively.

The third planarized region FPTHV3 may be between the lower stepped structure Sa and the second intermediate stepped structure Sb2. The second planarized region FPTHV2 may be between the second intermediate stepped structure Sb2 and the first intermediate stepped structure Sb1. The first planarized region FPTHV1 may be between the upper stepped structure Sc and the first intermediate stepped structure Sb1. The fourth planarized region FPTHV4, the third planarized region FPTHV3, the second planarized region FPTHV2, and the first planarized region FPTHV1 may be regions adjacent to the first contact region 120.

As illustrated in FIG. 15, each electrode structure ST may include the first wiring portion having a third width W3 and the second wiring portion having a fourth width W4. The first contact region 120 including the plurality of through wiring structures THV may be provided in the second wiring portion between the electrode structures ST. Descriptions of the first contact region 120 have been previously given with reference to FIGS. 8, 13, and the like and repeated descriptions thereof may be omitted.

In addition, the plurality of electrode structures ST may extend from the cell array region CAR to the connection region CNR in the first direction (X direction). The electrode structures ST may be spaced apart from each other in the second direction (Y direction) perpendicular to the first direction (X direction). The electrode structures ST adjacent to each other may be spaced apart from each other by the electrode separation region ESR in the second direction (Y direction) perpendicular to the first direction (X direction). The electrode separation region ESR may penetrate the electrode structures ST and separate respective electrode structures ST. The electrode separation region ESR may be referred to as a separation region.

According to some embodiments, the first gate isolation regions GIR1 penetrating each electrode structure ST in the cell array region CAR and the second gate isolation region GIR2 penetrating each electrode structure ST in the connection region CNR may be provided. The first gate isolation regions GIRL may extend in parallel with each other in the first direction (X direction), and the second gate isolation regions GIR2 may extend in parallel with each other in the first direction (X direction).

In some embodiments, in the connection region CNR, two of the second gate isolation regions GIR2 are illustrated for each electrode structure ST, but the inventive concept is not limited thereto, and the respective numbers of the first and second gate isolation regions GIRL and GIR2 may vary depending on the degree of integration and process conditions of the 3D semiconductor memory device 5-5.

In the connection region CNR, as illustrated in FIG. 18, dummy gate cutting regions DGIR penetrating the electrode structures ST may be provided except for the ground gate electrode GGE. The dummy gate isolation regions DIR may be provided in the second wiring portion of the electrode structure ST having the fourth width W4 in the connection region CNR.

The electrode separation regions ESR may be provided between the electrode structures ST adjacent to each other. One of the electrode separation regions ESR may extend in a straight line from the cell array region CAR to the connection region CNR.

As illustrated in FIG. 18, the ground select gate cutting region GGIR may be provided between the lowermost ground select gate electrodes GGE in the electrode structure ST in the second direction (Y direction). As described above, as the ground select gate cutting regions GGIR of the lowermost layer are provided in each electrode structure ST, the ground select gate electrodes GGE of the lowermost layer in each electrode structure ST may be spaced apart from each other in the second direction (Y direction), and may be electrically isolated from each other.

Specifically, the ground select gate electrodes GGE, which are at the lowermost gate electrode layer of the electrode structure ST, may be electrically isolated from each other by the ground select gate cutting region GGIR. As described above, the ground select gate cutting region GGIR may be formed in at least one of the cell array region CAR and the connection region CNR.

The ground select gate cutting region GGIR may be formed between the cell array region CAR and the connection region CNR in the first direction (X direction). The ground select gate cutting region GGIR may be in contact with or overlap the first contact region 120 that is in the connection region CNR. The ground select gate cutting region GGIR may electrically isolate the ground select gate electrodes GGE from each other, and accordingly, may improve the reliability of the 3D semiconductor memory device 5-5.

FIGS. 19A, 19B, 20A, 20B, 21A, 21B, 22, and 23 are drawings illustrating a method of manufacturing the 3D semiconductor memory device 5-3, according to an embodiment of the inventive concept.

Figure 19A:
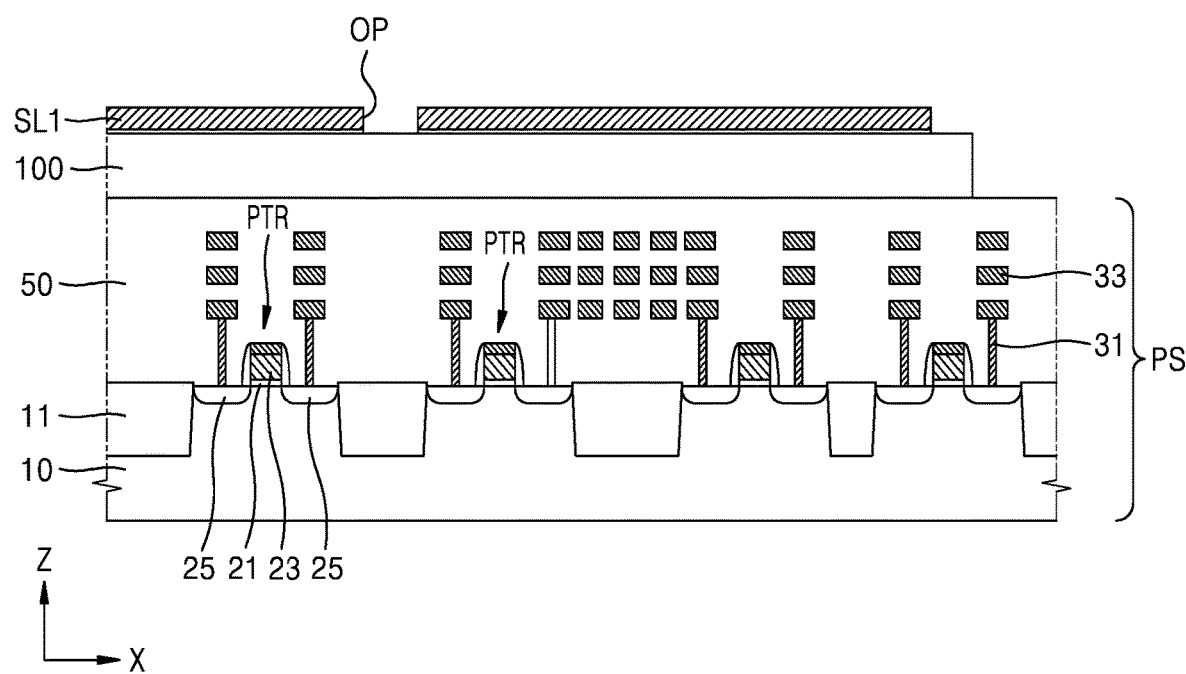
FIGS. 19A, 19B, 20A, 20B, 21A, 21B, 22, and 23 are diagrams illustrating a method of manufacturing a 3D semiconductor memory device, according to embodiments of the inventive concept.
Figure 19B:
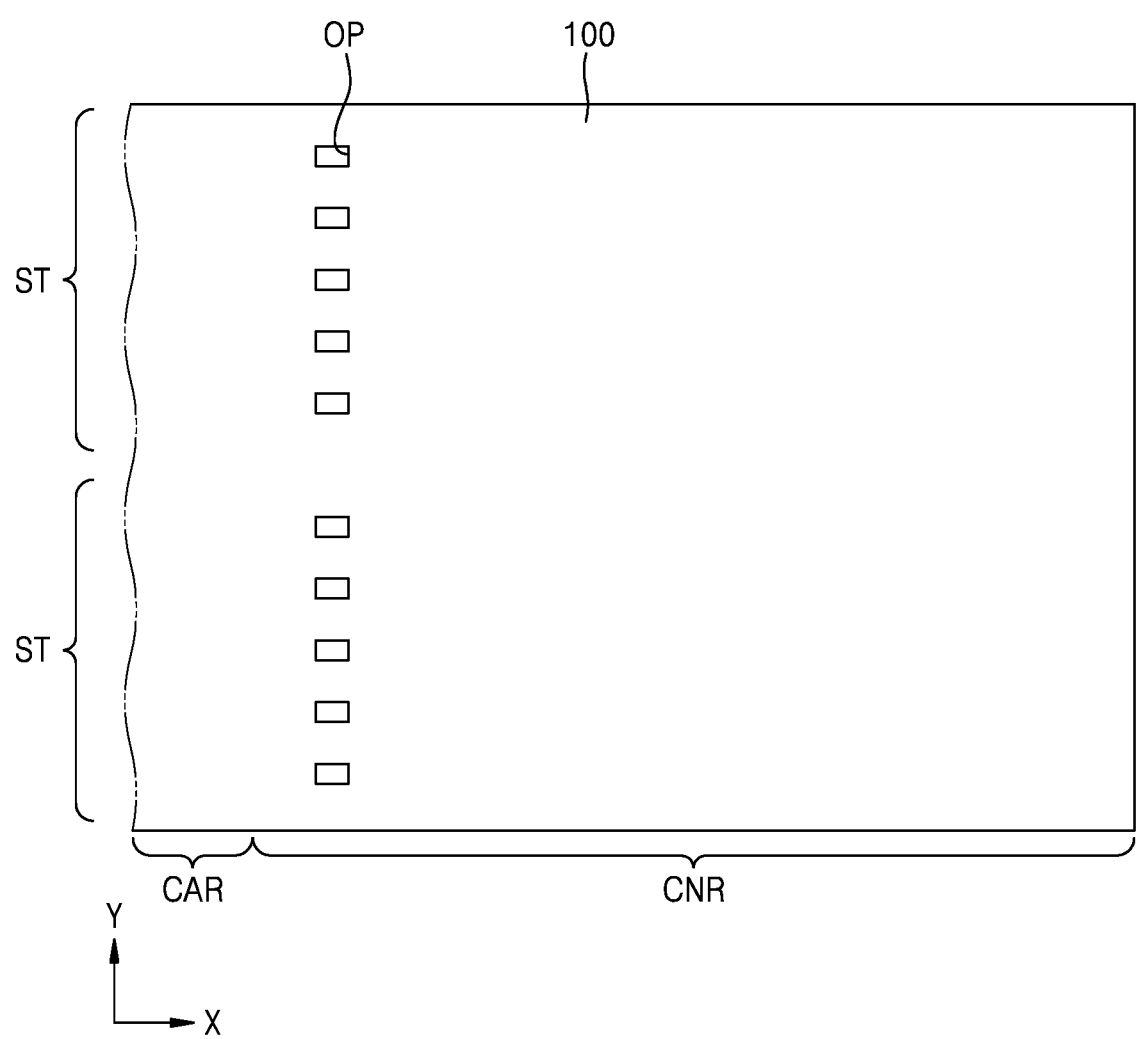
Figure 20A:
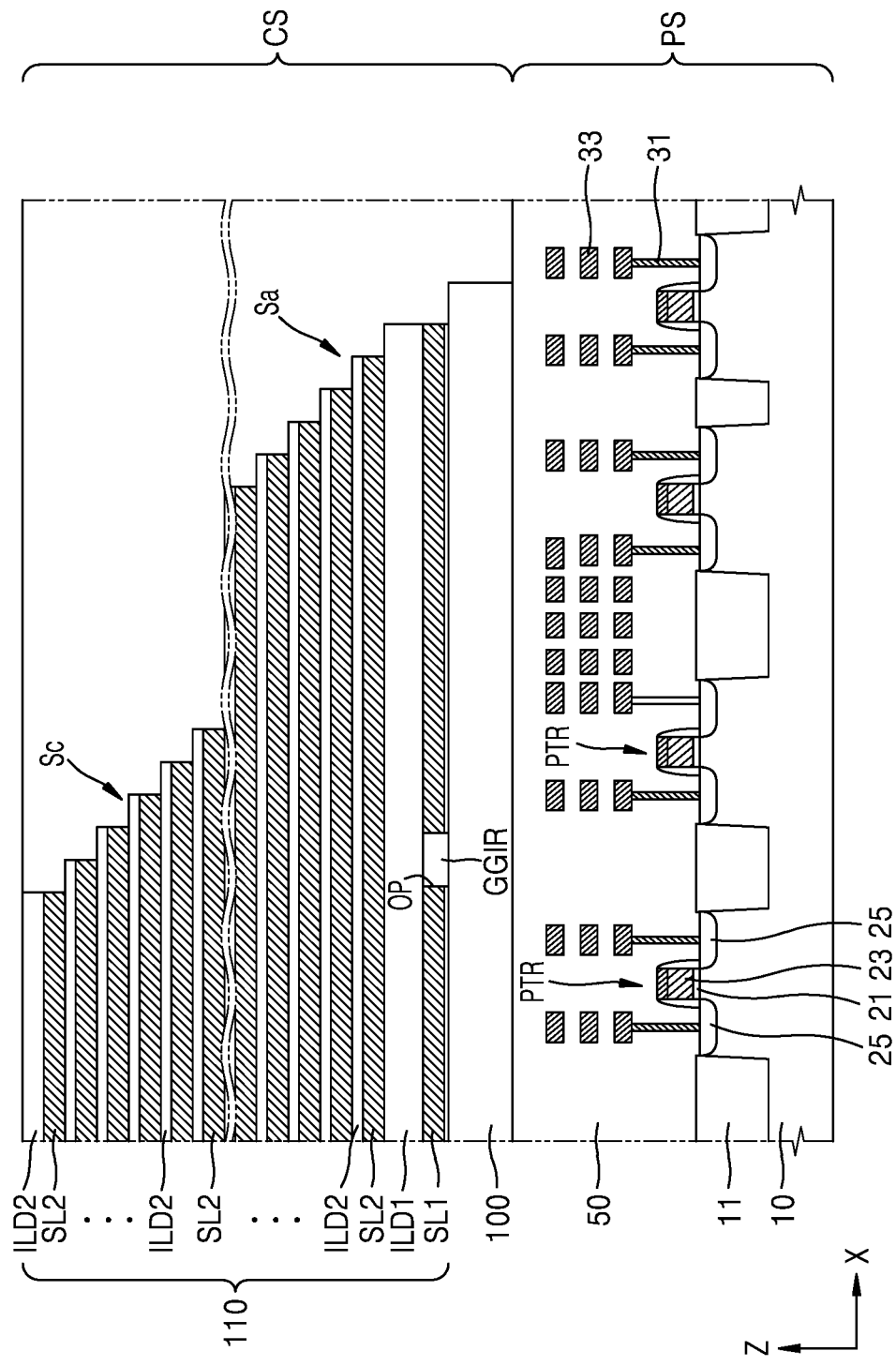
Figure 20B:
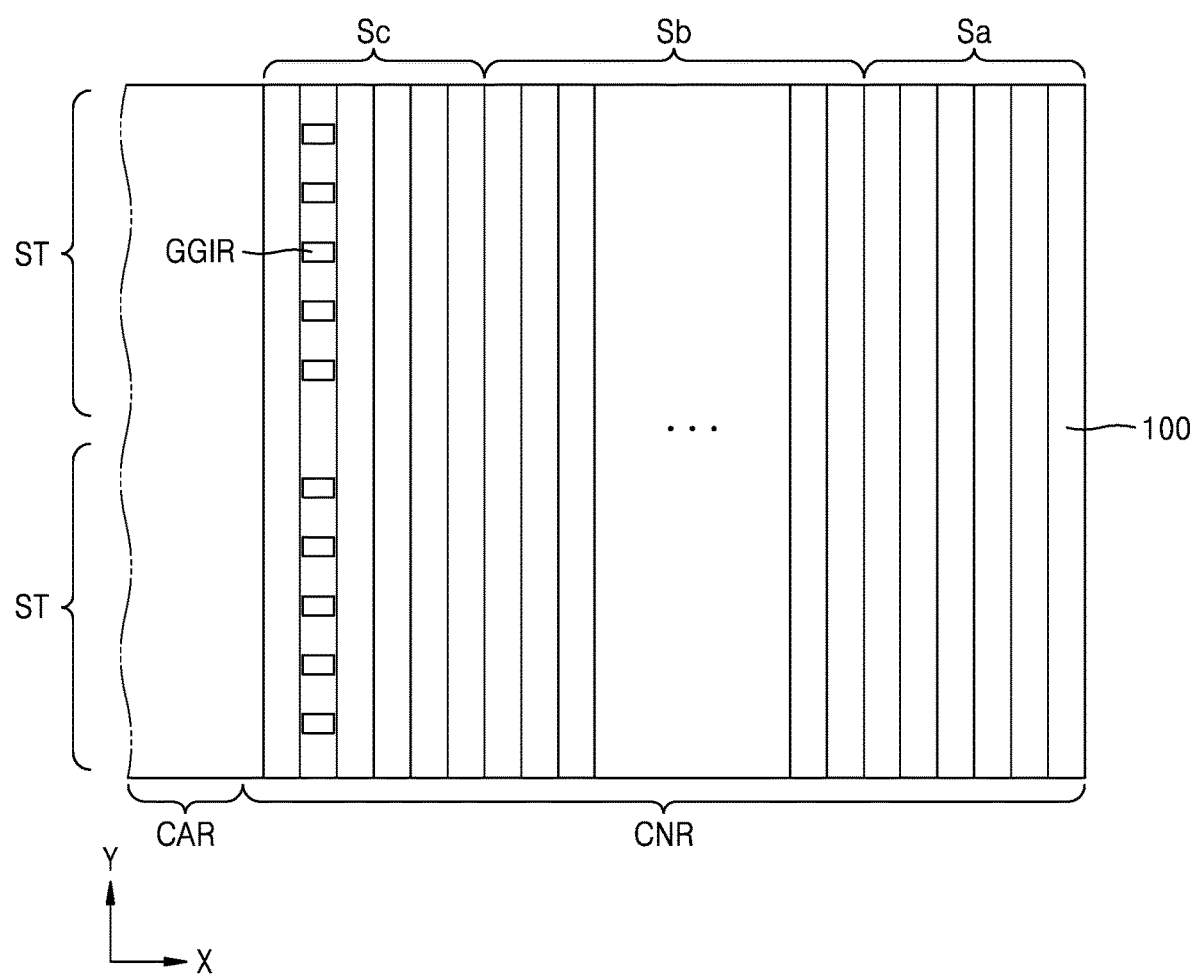
Figure 21A:
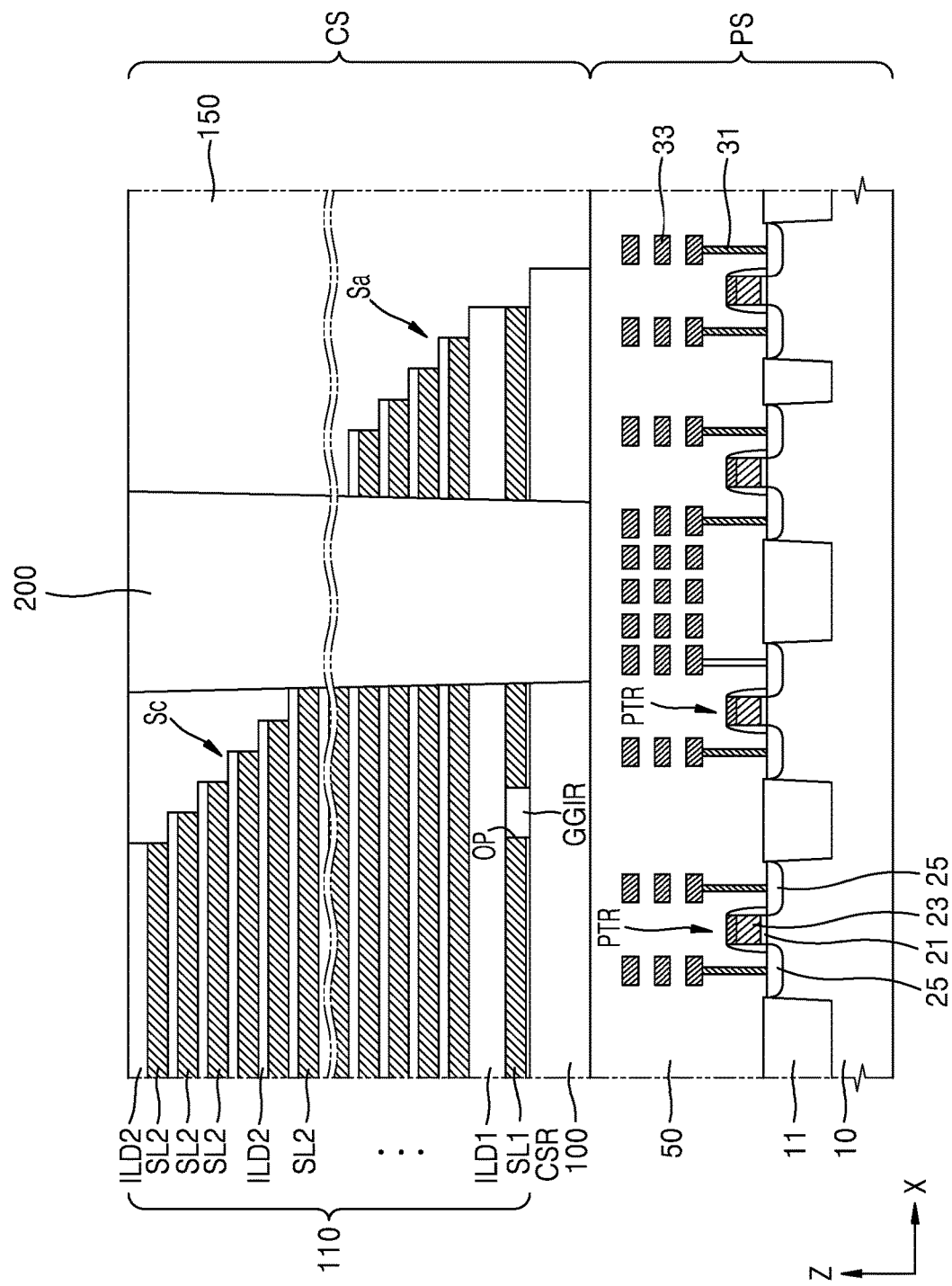
Figure 21B:
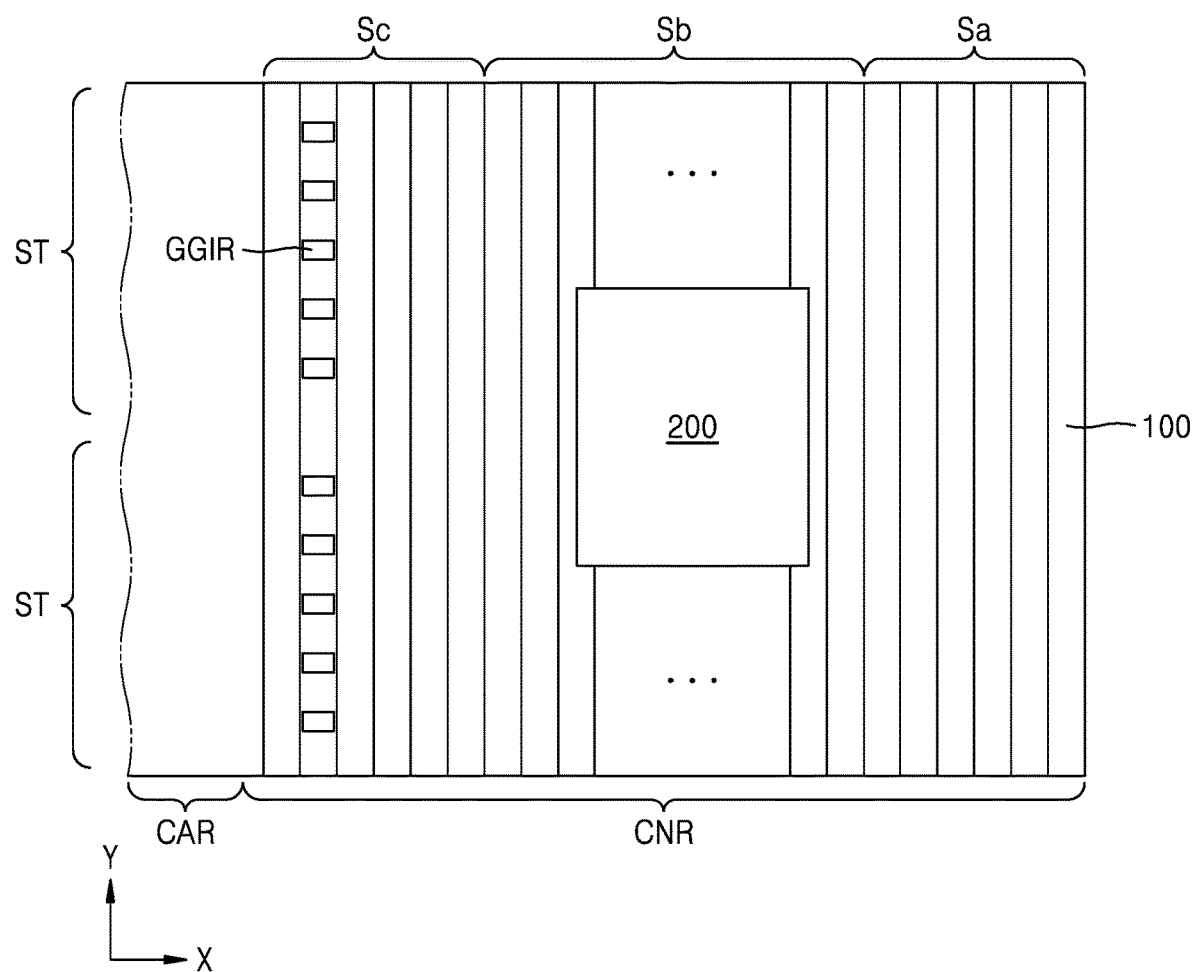

FIGS. 19A, 20A, 21A, 22, and 23 are cross-sectional views illustrating a method of manufacturing the 3D semiconductor memory device (5-3 in FIG. 8), and FIGS. 19B, 20B, and 21B are layout diagrams for describing a method of manufacturing the 3D semiconductor memory device (5-3 in FIG. 8). FIGS. 19B, 20B, and 21B are described by using memory blocks including two electrode structures ST. In some embodiments, one electrode structure ST may constitute one memory block.

Referring to FIGS. 19A and 19B, the peripheral logic structure PS may be formed on the semiconductor substrate 10. Forming the peripheral logic structure PS may include forming the peripheral logic circuits PTR on the semiconductor substrate 10, forming peripheral wiring structures 31 and 33 connected to the peripheral logic circuits PTR, and forming the lower buried insulating layer 50.

The horizontal semiconductor layer 100 may be formed on the lower buried insulating layer 50. The horizontal semiconductor layer 100 may, as described above, include the cell array region CAR and the connection region CNR. For example, the horizontal semiconductor layer 100 may be formed by depositing a polysilicon layer to cover the entire surface of the lower buried insulating layer 50 and then patterning the polysilicon layer. During the deposition of the polysilicon layer, impurities of a first conductivity type may be doped into the polysilicon layer. The horizontal semiconductor layer 100 may be patterned to expose a portion of the lower buried insulating layer 50.

Next, a lower sacrificial layer SL1 having gate openings OP may be formed on the horizontal semiconductor layer 100. The gate openings OP may be formed by etching the lower sacrificial layer SL1 so that portions of the horizontal semiconductor layer 100 are exposed in the connection region CNR. The gate openings OP may, as illustrated in FIG. 19B, be spaced apart from each other in the second direction (Y direction). The gate openings OP may also be spaced apart from each other in the first direction (X direction).

Referring to FIGS. 20A and 20B, the ground select gate cutting region GGIR may be formed in the gate openings OP. A particular formation process of the ground select gate cutting region GGIR is described later. The ground select gate cutting region GGIR and the lower insulating layer ILD1 covering the entire surface of the horizontal semiconductor layer 100 may be formed. The lower insulating layer ILD1 may have a planarized top surface.

Next, a mold structure 110 in which upper sacrificial layers SL2 and the upper insulating layers ILD2 are vertically and alternately stacked may be formed on the lower insulating layer ILD1. For example, the lower and upper sacrificial layers SL1 and SL2 may include a silicon nitride layer. The lower and upper sacrificial layers SL1 and SL2 may include a silicon nitride layer.

The mold structure 110 may have a stepped structure by using a trimming process in the connection region CNR of the horizontal semiconductor layer 100. By the trimming process, the mold structure 110 may have the lower, intermediate, and upper stepped structures Sa, Sb, and Sc, which have a downward shape as they move away from the cell array region CAR. As illustrated in FIG. 20B, the upper stepped structure Sc of the mold structure 110 may overlap the ground select gate cutting region GGIR.

After the mold structure 110 is formed, the upper buried insulating layer 150 may be formed on the entire surface of the horizontal semiconductor layer 100. The upper buried insulating layer 150 may have a substantially flat top surface. The upper buried insulating layer 150 may be formed by forming a buried insulating layer thicker than the mold structure 110, and then performing a planarization process.

Referring to FIGS. 21A and 21B, a through insulating pattern 200 penetrating a portion of the mold structure 110, a portion of the lower sacrificial layer SL1, and a portion of the horizontal semiconductor layer 100 may be formed. In an example, the through insulating pattern 200 may penetrate a portion of an intermediate stepped structure Sb (FIG. 21B) of the mold structure 110. The through insulating pattern 200 may be spaced apart from the ground select gate cutting region GGIR formed in the lower sacrificial layer SL1.

Figure 22:
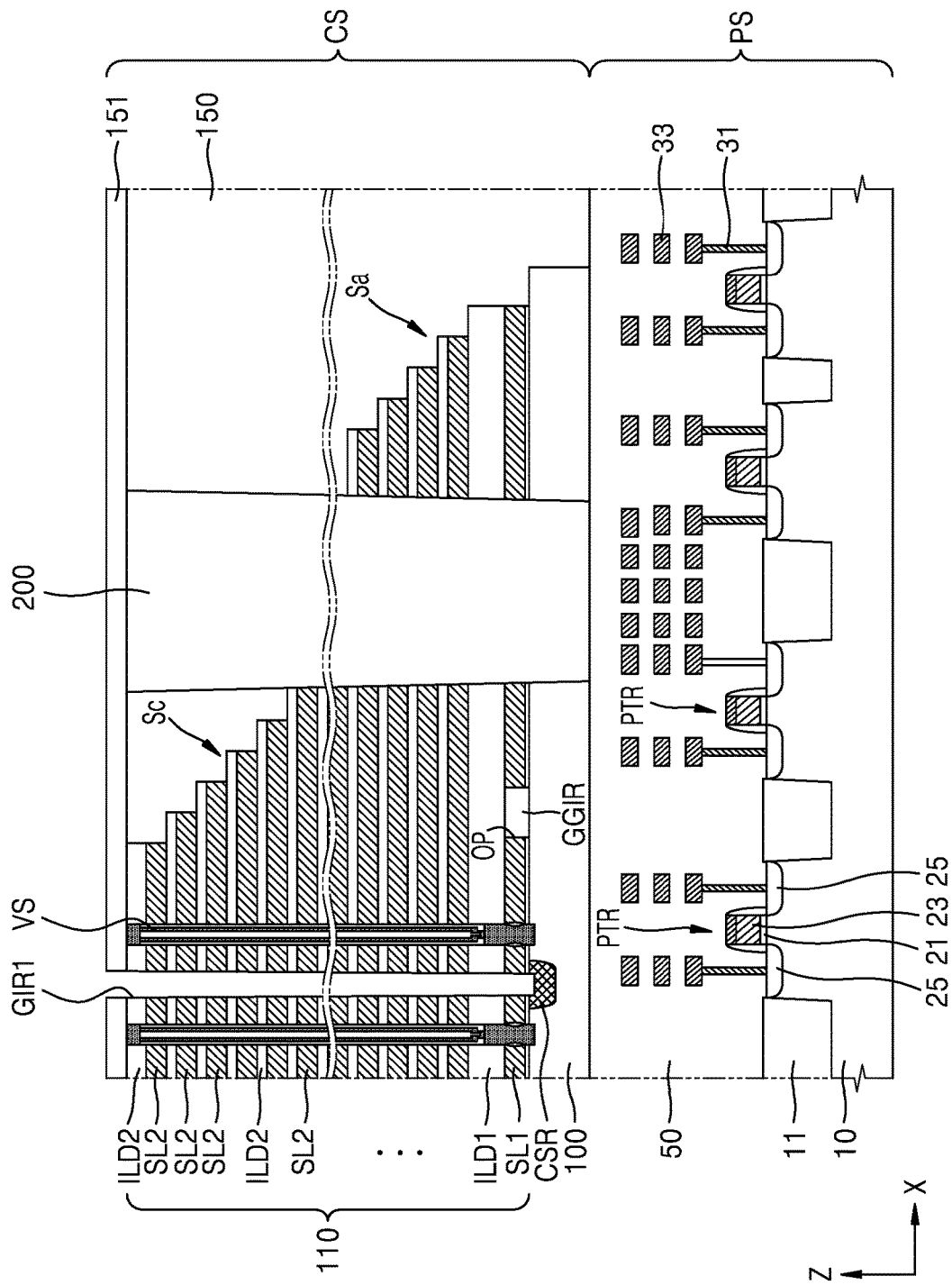

Referring to FIG. 22, the vertical structures VS penetrating the mold structure 110, the lower insulating layer ILD1, and the lower sacrificial layer SL1 on the horizontal semiconductor layer 100 of the cell array region CAR may be formed. Next, the first interlayer insulating layer 151 covering the top surfaces of the vertical structures VS may be formed on the upper buried insulating layer 150. After the first interlayer insulating layer 151 is formed, the first and second gate isolation regions GIR1 and GIR2 exposing the horizontal semiconductor layer 100 by penetrating the mold structure 110 and the lower sacrificial layer SL1, the dummy gate isolation regions DIR, and the electrode isolation regions ESR may be formed.

In some embodiments, the first gate isolation regions GIRL may extend in parallel with each other in the cell array region CAR in the first direction (X direction). The second gate isolation regions GIR2 may be spaced apart from the first gate isolation regions GIRL with the ground select gate cutting region GGIR therebetween in the first direction (X direction).

Figure 23:
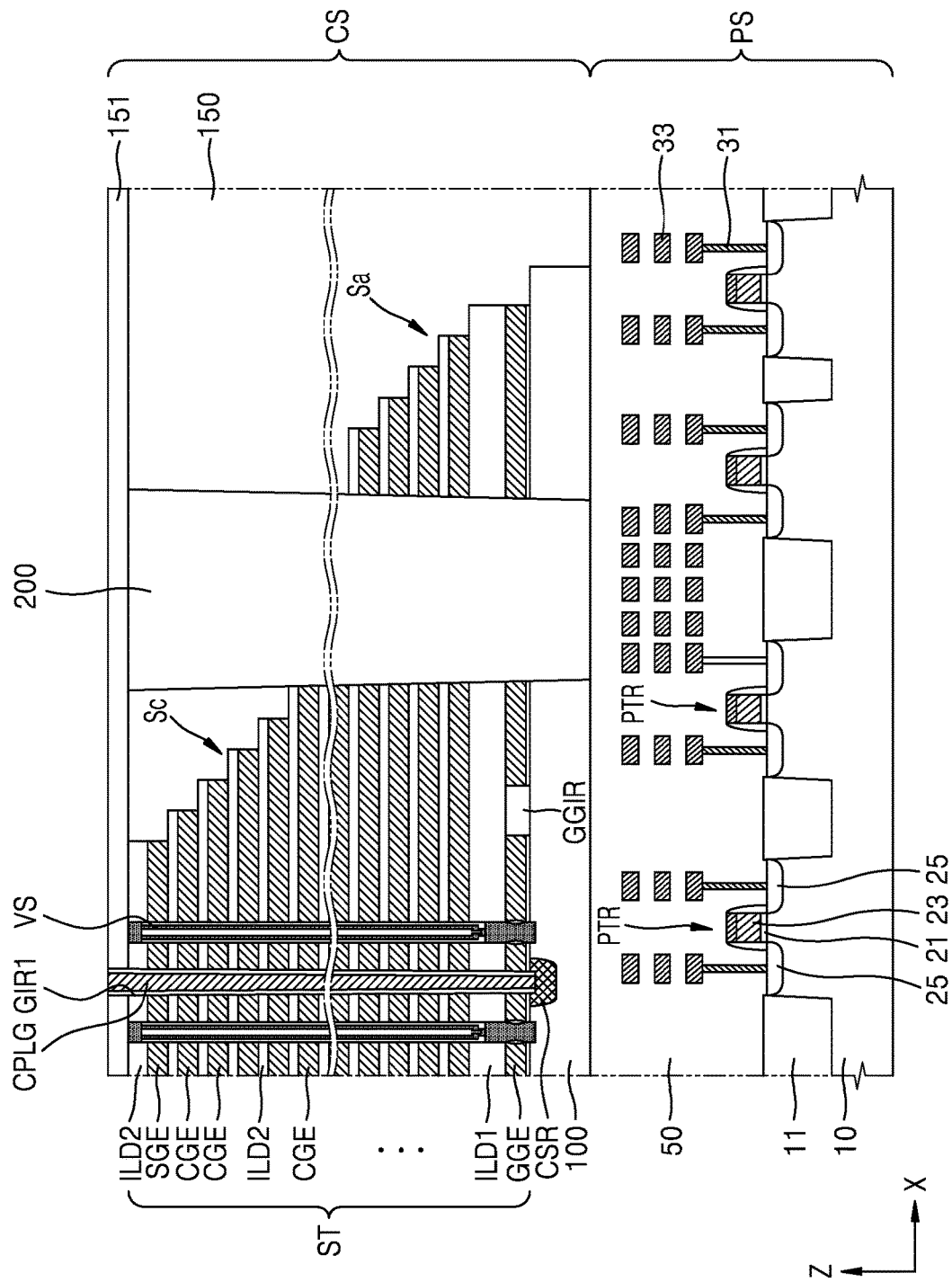

Referring to FIG. 23, the electrode structure ST may be formed by performing a process of replacing the lower sacrificial layer SL1 and the upper sacrificial layer SL2, that are exposed to the first and second gate isolation regions GIRL and GIR2, the dummy gate isolation regions DIR, and the electrode separation regions ESR, with the ground select gate electrodes GGE, the cell gate electrodes CGE, and the string select gate electrodes SGE.

By removing the lower and upper sacrificial layers SL1 and SL2 exposed to the first and second gate isolation regions GIRL and GIR2, the dummy gate isolation regions DIR, and the electrode isolation regions ESR, gate regions may be formed between the lower and upper insulating layers ILD1 and ILD2. The lower sacrificial layer SL1 and the upper sacrificial layers SL2 may be isotropically etched by using an etch recipe having etch selectivity for the lower and upper insulating layers ILD1 and ILD2, the vertical structures VS, and the semiconductor substrate 10. The gate regions may extend horizontally between the lower and upper insulating layers ILD1 and ILD2, and expose portions of sidewalls of the vertical structures VS.

Next, the horizontal insulating patterns (HP in FIGS. 9A and 9B) and the ground select gate electrodes GGE, the cell gate electrodes CGE, and the string select gate electrodes SGE may be formed in the gate regions. The horizontal insulating patterns HP and the ground select gate electrodes GGE, the cell gate electrodes CGE, and the string select gate electrodes SGE may be formed by sequentially forming a horizontal insulating layer, a barrier metal layer (for example, TiN, tantalum nitride (TaN), or WN), and a metal layer (for example, W) on the mold structure 110 in which the gate regions are formed, and by anisotropically etching the barrier metal layer and the metal layer, which have been deposited inside trenches. In this case, the horizontal insulation pattern HP may be a portion of the data storage layer of the NAND flash memory transistor, and may include a silicon oxide layer and/or a high-k dielectric layer.

After the ground select gate electrodes GGE, the cell gate electrodes CGE, and the string select gate electrodes SGE are formed, the first and second gate isolation regions GIRL and GIR2, the dummy gate isolation regions DIR, and the electrode isolation regions ESR may be filled with an insulating material. In addition, a common source plug CPLG connected to the common source region CSR may be formed in the first gate isolation regions GIR1 that are filled with the insulating material.

Thereafter, as illustrated in FIG. 8, the second interlayer insulating layer 153 may be formed on the first interlayer insulating layer 151. Next, the bit line contact plugs BPLG of the cell array region CAR, the lower, intermediate, and upper contact plugs PLGa, PLGb, and PLGc connected to the ground select gate electrodes GGE, the cell gate electrodes CGE, and the string select gate electrodes SGE in the connection region CNR, the through contact plugs TPLG and the connection contact plugs PPLG penetrating the through insulating pattern 200 may be formed.

FIGS. 24A through 24D are cross-sectional views illustrating a method of manufacturing the ground select gate cutting region GGIR of a 3D semiconductor memory device, according to embodiments of the inventive concept.

Figure 24A:
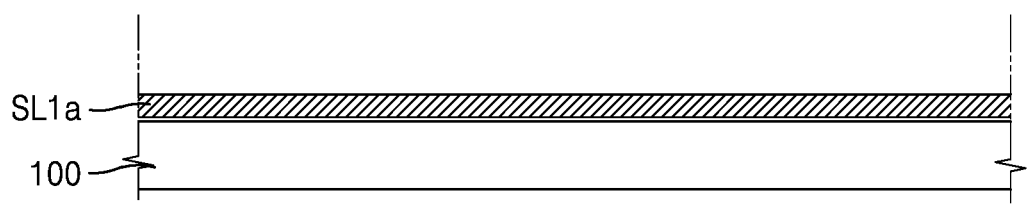
FIGS. 24A through 24D are cross-sectional views illustrating a method of manufacturing a ground selection gate cutting region of a 3D semiconductor memory device, according to embodiments of the inventive concept.
Figure 24B:
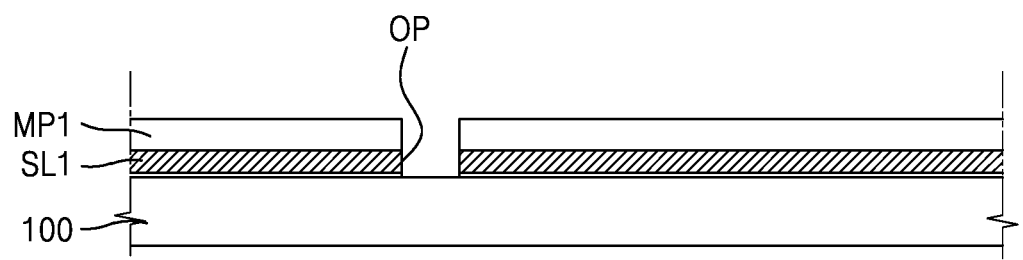

Referring to FIGS. 24A and 24B, as illustrated in FIG. 24A, a lower sacrificial material layer SL1a may be formed on the horizontal semiconductor layer 100. As illustrated in FIG. 24B, a mask pattern MP1 may be formed on the lower sacrificial material layer SL1a.

Next, the lower sacrificial layer SL1 including the gate opening OP may be formed by selectively etching the lower sacrificial material layer SL1a by using the mask pattern MP1 as an etch mask. The lower sacrificial layer SL1 may, as described above, may become the ground select gate electrode GGE by using a replacement process. Accordingly, the shape or form of the ground select gate cutting region GGIR may be changed in a planar manner by a later process according to a planar overlap relationship between the lower sacrificial layer SL1 and the mask pattern MP1.

Figure 24C:
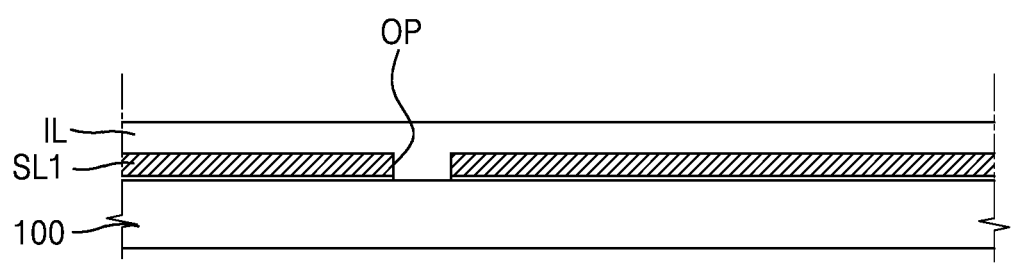
Figure 24D:
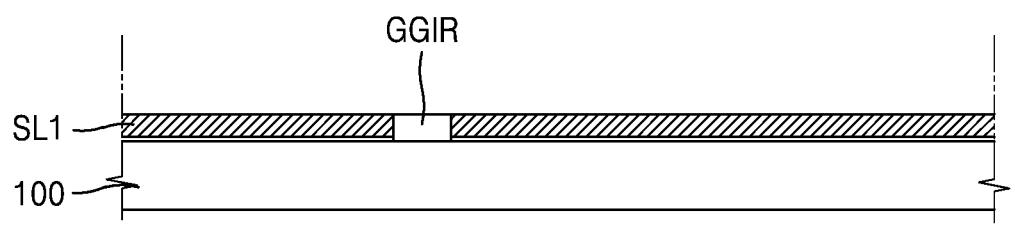

Referring to FIGS. 24C and 24D, after the mask pattern MP1 is removed as illustrated in FIG. 24C, an insulating layer IL may be formed on the lower sacrificial layer SL1 including the gate opening OP. Accordingly, the insulating layer IL may fill the gate opening OP.

As illustrated in FIG. 24D, the ground select gate cutting region GGIR may be formed by planarizing the insulating layer IL. Accordingly, the ground select gate cutting region GGIR may be an insulating region that may have a flat upper surface. The ground select gate cutting region GGIR may cut the ground select gate electrode GGE in one direction by using a post process. As described above, the shape or form of the ground select gate cutting region GGIR may be changed in a planar manner according to a planar overlap relationship between the lower sacrificial layer SL1 and the mask pattern MP1.

In FIGS. 24A through 24D, a method of forming the ground select gate cutting region GGIR is described as an example, but the ground select gate cutting region GGIR may be formed by various methods.

FIGS. 25A through 25D illustrate layout diagrams illustrating various overlap relationships between gate isolation regions and ground select gate cutting regions of a 3D semiconductor memory device, according to an embodiment of the inventive concept.

As described above with reference to FIGS. 11A-11C, the 3D semiconductor memory device may have different overlap relationships between the first and second isolation regions GIRL and GIR2 and the fifth through eighth ground select gate cutting regions GGIR5 through GGIR8 on the level of the ground select gate electrode GGE according to various layouts.

Figure 25A:
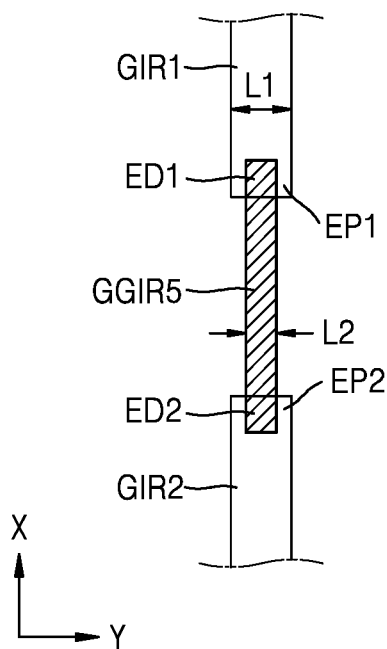
FIGS. 25A through 25D are layout diagrams illustrating various overlap relationships between a gate isolation region and a ground selection gate cutting region of a 3D semiconductor memory device, according to an embodiment of the inventive concept.

As illustrated in FIG. 25A, two of the first and second gate isolation regions GIR1 and GIR2 may be spaced apart from each other in the first direction (X direction). The first and second gate isolation regions GIR1 and GIR2 may include the first and second end portions EP1 and EP2, respectively. Widths of the first and second gate isolation regions GIR1 and GIR2 may be L1.

The fifth ground select gate cutting region GGIR5 may include the first end portion ED1 and the second end portion ED2. A width L2 of the fifth ground select gate cutting region GGIR5 may be less than the width L1 of the first and second gate isolation regions GIR1 and GIR2. The fifth ground select gate cutting region GGIR5 may be rectangular or line-shaped. The fifth ground select gate cutting region GGIR5 may overlap the first and second end portions EP1 and EP2 of the first and second gate isolation regions GIR1 and GIR2 in a planar manner (e.g., in a plan view), respectively. A length (or a width) in the second direction (Y direction) of the fifth ground select gate cutting region GGIR5 may be less than lengths (or widths) in the second direction (Y direction) of the first and second gate isolation regions GIR1 and GIR2.

Figure 25B:
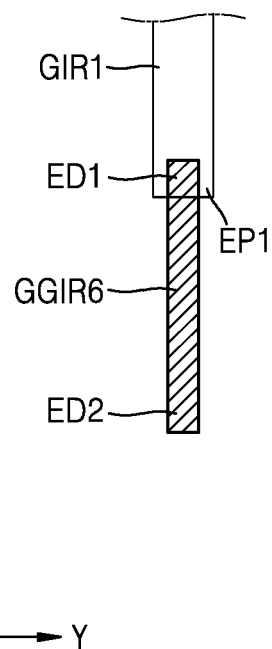

As illustrated in FIG. 25B, the sixth ground select gate cutting region GGIR6 may overlap the first end portion EP1 of the first gate isolation region GIR1 in a planar manner. The sixth ground select gate cutting region GGIR6 may be rectangular or line-shaped.

Figure 25C:
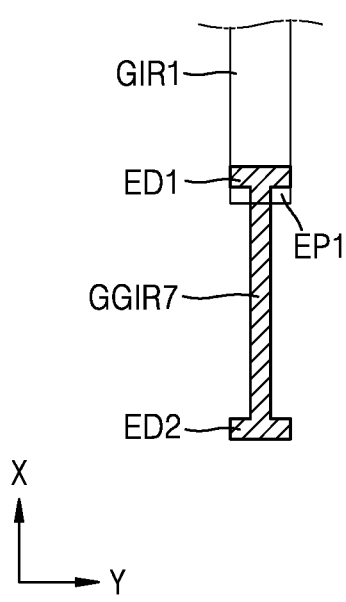

As illustrated in FIG. 25C, the seventh ground select gate cutting region GGIR7 may overlap the first end portion EP1 of the first gate isolation region GIR1 in a planar manner. The seventh ground select gate cutting region GGIR7 may be I-shaped.

Figure 25D:
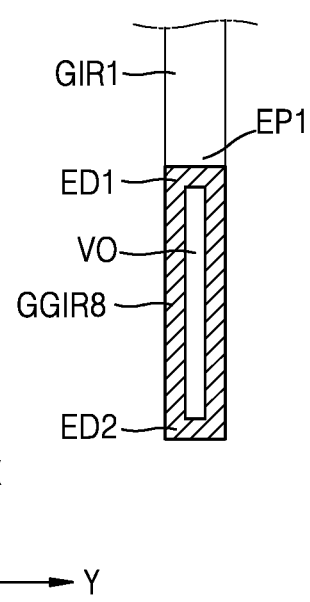

As illustrated in FIG. 25D, the eighth ground select gate cutting region GGIR8 may overlap the first end portion EP1 of the first gate isolation region GIR1 in a planar manner. The eighth ground select gate cutting region GGIR8 including an inner via opening VO may be rectangular or line-shaped.

Figure 26A:
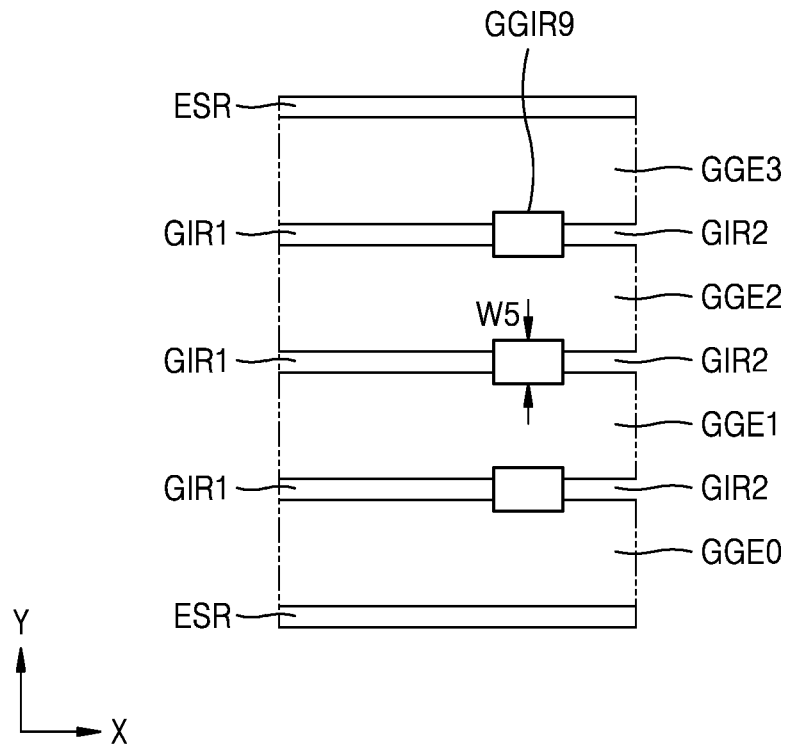
FIGS. 26A and 26B are layout diagrams illustrating various overlap relationships between gate isolation regions, ground gate electrodes, and a ground selection gate cutting region of the 3D semiconductor memory device, according to an embodiment of the inventive concept.
Figure 26B:
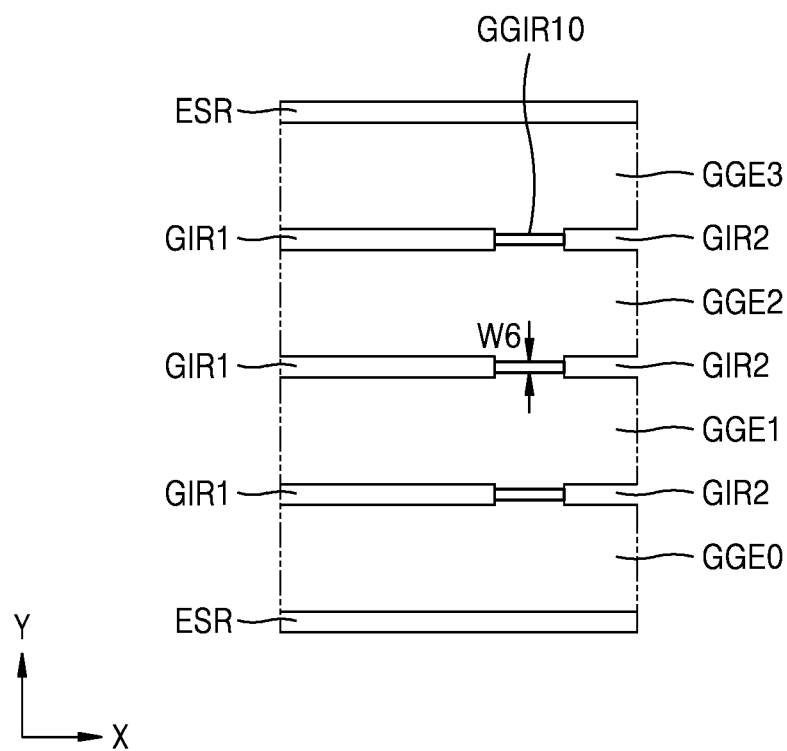

FIGS. 26A and 26B are layout diagrams illustrating various overlap relationships between gate isolation regions, ground gate electrodes, and ground select gate cutting regions of the 3D semiconductor memory device, according to an embodiment of the inventive concept.

The 3D semiconductor memory device may be separated by the electrode separation region ESR for each memory block BLK. A plurality of, for example, four of the zeroth through third ground select gate electrodes GGE0 through GGE3 may be in the memory block BLK. The zeroth through third ground gate electrodes GGE0 through GGE3 may be separated by the first and second gate isolation regions GIR1 and GIR2 in the memory block BLK.

As illustrated in FIG. 26A, on the level of the zeroth through third ground select gate electrodes GGE0 to GGE3, the ninth ground select gate cutting region GGIR9 may overlap the first and second gate isolation regions GIR1 and GIR2 with a wide width W5. In other words, on the levels of the zeroth through third ground gate electrodes GGE0 through GGE3, the ninth ground select gate cutting region GGIR9 may overlap the first and second gate isolation regions GIR1 and GIR2 and the zeroth through third ground gate electrodes GGE0 through GGE3.

As illustrated in FIG. 26B, on the level of the zeroth through third ground select gate electrodes GGE0 to GGE3, the tenth ground select gate cutting region GGIR10 may overlap the first and second gate isolation regions GIR1 and GIR2 with a narrow width W6. In other words, on the level of the zeroth through third ground select gate electrodes GGE0 to GGE3, the tenth ground select gate cutting region GGIR10 may overlap only the first and second gate isolation regions GIRL and GIR2.

Figure 27A:
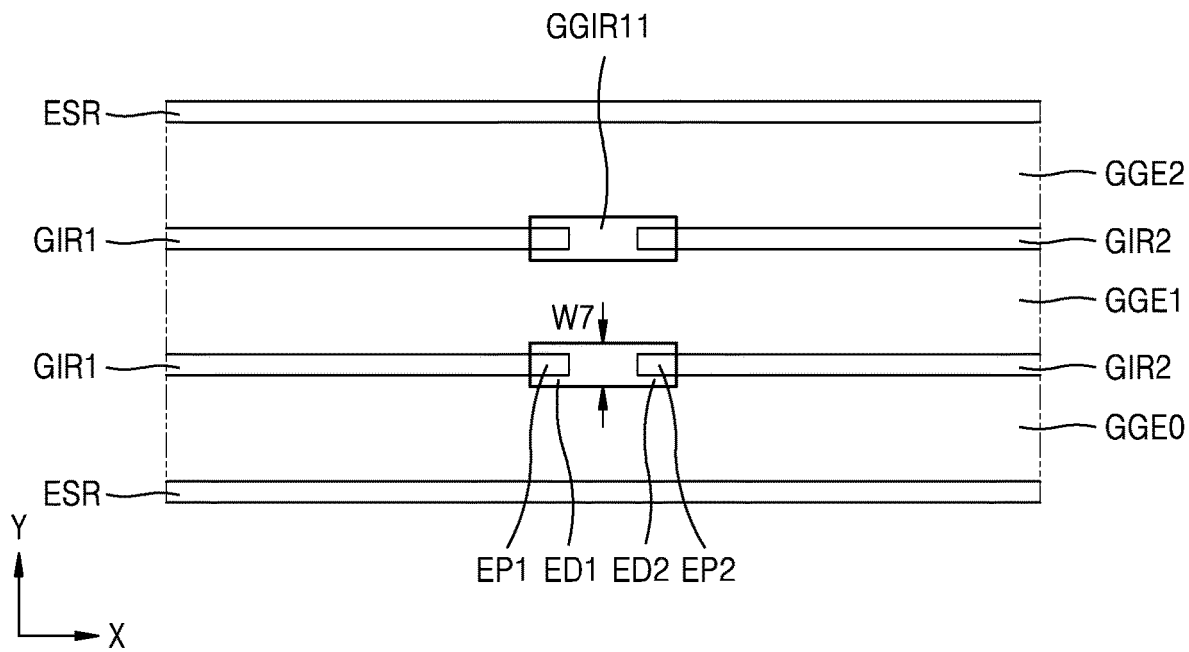
FIGS. 27A and 27B are layout diagrams illustrating various overlap relationships between gate isolation regions, a contact region, ground gate electrodes, and a ground selection gate cutting region of the 3D semiconductor memory device, according to an embodiment of the inventive concept.
Figure 27B:
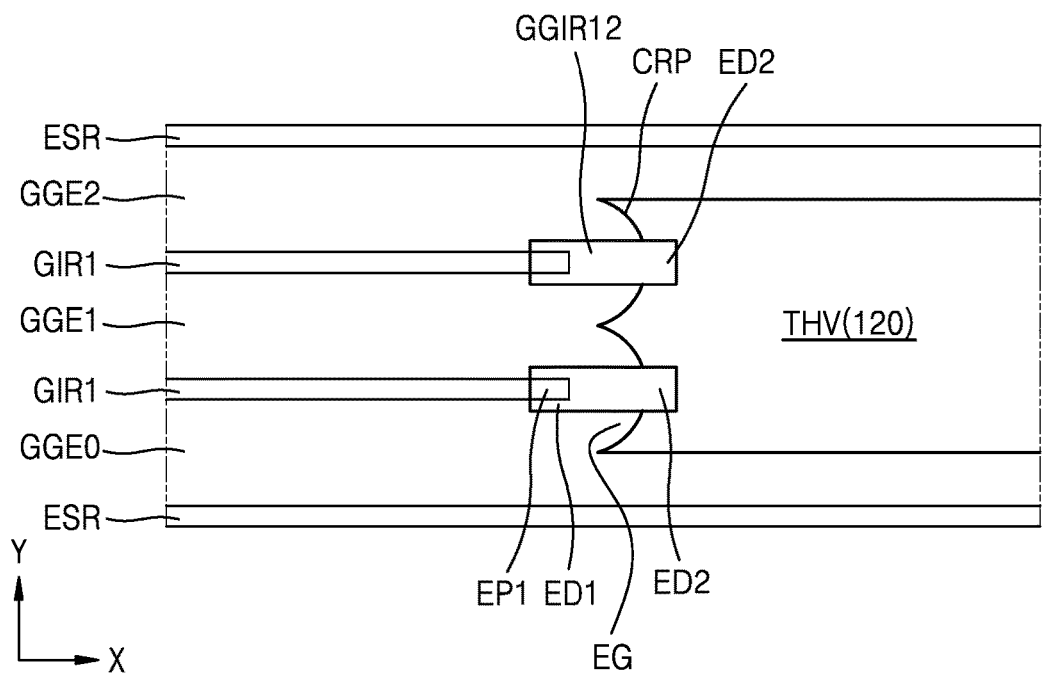

FIGS. 27A and 27B are layout diagrams illustrating various overlap relationships between gate isolation regions, a contact region, ground gate electrodes, and ground select gate cutting regions of a 3D semiconductor memory device, according to an embodiment of the inventive concept.

A plurality of, such as three of, the zeroth through second ground gate electrodes GGE0 through GGE2 of the 3D semiconductor memory device may be separated by the electrode separation region ESR for each memory block BLK. The zeroth through second ground gate electrodes GGE0 through GGE2 may be separated by the first and second gate isolation regions GIR1 and GIR2 in the memory block BLK.

As illustrated in FIG. 27A, on the level of the zeroth through second ground select gate electrodes GGE0 through GGE2, the eleventh ground select gate cutting region GGIR11 may overlap the first and second gate isolation regions GIR1 and GIR2 with a wide width W7. In other words, on the levels of the zeroth through second ground gate electrodes GGE0 through GGE2, the eleventh ground select gate cutting region GGIR11 may overlap the first and second gate isolation regions GIR1 and GIR2 and the zeroth through second ground gate electrodes GGE0 through GGE2. In addition, the first and second end portions ED1 and ED2 of the eleventh ground select gate cutting region GGIR11 may overlap the first and second end portions EP1 and EP2 of the first and second gate isolation regions GIR1 and GIR2, respectively.

As illustrated in FIG. 27B, on the level of the zeroth through second ground select gate electrodes GGE0 through GGE2, the twelfth ground select gate cutting region GGIR12 may overlap the first gate isolation region GIR1 and the first contact region 120 including the through wiring structure THV. A plurality of, for example, two of, the ground select gate cutting regions GGIR12 may overlap the first contact region 120 in a planar manner. The number of overlapped regions between the first contact region 120 and the twelfth ground select gate cutting region GGIR12 may vary depending on the size of the first contact region 120.

In addition, the first end portion ED1 of the twelfth ground select gate cutting region GGIR12 may overlap the first end portion EP1 of the first gate isolation region GIR1 in a planar manner. The second end portion ED2 of the twelfth ground select gate cutting region GGIR12 may overlap the first contact region 120 in a planar manner.

In addition, on the level of the zeroth through second ground select gate electrodes GGE0 through GGE2, one end portion EG of the zeroth through second ground select gate electrodes GGE0 through GGE2 may be in contact with the first contact region 120 and have a curved profile CRP. For example, on the level (i.e., at the level) of the zeroth through second ground select gate electrodes GGE0 through GGE2, the one end portion EG of the zeroth through second ground select gate electrodes GGE0 through GGE2 that has the curved profile CRP may be obtained by a replacement process of the zeroth through second ground select gate electrodes GGE0 through GGE2.

While the inventive concept has been particularly shown and described with reference to embodiments thereof, it will be understood that various changes in form and details may be made therein without departing from the scope of the following claims.

What is claimed is:

1. A three-dimensional (3D) semiconductor memory device, comprising:
   a semiconductor substrate;
   electrode structures, each of the electrode structures comprising a plurality of electrodes stacked on the semiconductor substrate, the electrode structures, as viewed in a plan view, extending in a first direction and being spaced apart from each other by electrode separation regions in a second direction perpendicular to the first direction, the first and second directions defining a plane that is parallel to an upper surface of the semiconductor substrate, wherein the plurality of electrodes in each of the electrode structures, as viewed in a cross-sectional view, are stacked on the semiconductor substrate in a third direction perpendicular to the first and second directions;

ground select gate electrodes comprising lowermost electrodes among the plurality of electrodes of the electrode structures; and at least one ground select gate cutting region that overlaps at least a corresponding one of the electrode separation regions on a level of the ground select gate electrodes in the third direction, as viewed in a plan view, and electrically isolates the ground select gate electrodes from each other;

wherein the plurality of electrodes in each of at least a subset of the electrode structures are spaced apart from each other in the second direction by one or more gate isolation regions, the gate isolation regions comprising a first end portion on the level of the ground select gate electrodes;

wherein the gate isolation regions comprise a first isolation region comprising the first end portion and a second isolation region comprising a second end portion spaced apart from the first isolation region in the first direction, and wherein the at least one ground select gate cutting region overlaps the first end portion of the first isolation region and the second end portion of the second isolation region in a third direction that is perpendicular to the first direction and the second direction.

2. The device of claim 1, wherein the semiconductor substrate comprises a cell array region and a connection region, the electrode structures extend from the cell array region to the connection region in the first direction, and the at least one ground select gate cutting region is in the cell array region or the connection region.

3. The device of claim 1,
wherein the plurality of electrodes in each of at least a subset of the electrode structures are spaced apart from each other in the second direction by one or more gate isolation regions, the gate isolation regions comprising a first end portion on the level of the ground select gate electrodes, wherein the gate isolation regions further comprise a second end portion spaced apart from the first end portion and opposite to the first end portion, and wherein the at least one ground select gate cutting region overlaps both the first end portion and the second end portion of the gate isolation regions.

4. The device of claim 1, wherein a length of the at least one ground select gate cutting region in the second direction is greater than a length of the electrode separation regions in the second direction.

5. The device of claim 1, wherein a length of the at least one ground select gate cutting region in the second direction is less than a length of the electrode separation regions in the second direction.

6. The device of claim 1, wherein a first length of the at least one ground select gate cutting region in the first direction is less than a second length thereof in the second direction.

7. The device of claim 1, wherein a first length of the at least one ground select gate cutting region in the first direction is greater than a second length thereof in the second direction.

8. The device of claim 1, wherein the at least one ground select gate cutting region is line-shaped, I-shaped, or line-shaped with an inner via opening.

9. The device of claim 1, wherein the plurality of electrodes in each of at least a subset of the electrode structures are spaced apart from each other in the second direction by one or more gate isolation regions, the gate isolation regions comprising a first end portion on the level of the ground select gate electrodes, and wherein the at least one ground select gate cutting region overlaps the first end portion of the gate isolation regions.

10. A three-dimensional (3D) semiconductor memory device, comprising:

a peripheral logic structure on a semiconductor substrate;

a horizontal semiconductor layer on the peripheral logic structure, the horizontal semiconductor layer comprising a cell array region and a connection region electrically connected to the cell array region;

electrode structures, each of the electrode structures comprising a plurality of electrodes stacked on the horizontal semiconductor layer in the cell array region and the connection region, the electrode structures, as viewed in a plan view, extending in a first direction and being spaced apart from each other by separation regions in a second direction perpendicular to the first direction, the first and second directions defining a plane that is parallel to an upper surface of the semiconductor substrate, wherein the plurality of electrodes in each of the electrode structures, as viewed in a cross-sectional view, are stacked on the semiconductor substrate in a third direction perpendicular to the first and second directions;

at least one contact region comprising a through wiring structure electrically connecting the electrode structures to the peripheral logic structure in the connection region; and ground select gate electrodes comprising lowermost electrodes among the plurality of electrodes of the electrode structures in the cell array region and the connection region, wherein at least one ground select gate cutting region overlaps the at least one contact region on a level of the ground select gate electrodes in the third direction, as viewed in a plan view, and electrically isolates the ground select gate electrodes from each other;

wherein the separation regions comprise first and second portions that are spaced apart from the at least one contact region in the second direction, and wherein the first and second portions of the separation regions are in parallel with each other in a straight line shape in the first direction.

11. The device of claim 10,
wherein the at least one contact region comprises a plurality of contact regions spaced apart from each other in the first direction, and wherein the at least one ground select gate cutting region is between the plurality of contact regions.

12. The device of claim 10, wherein, on the level of the ground select gate electrodes, a profile of one side surface of the ground select gate electrodes adjacent to the at least one contact region and the at least one ground select gate cutting region is curve-shaped.

13. A three-dimensional (3D) semiconductor memory device, comprising:

a peripheral logic structure on a semiconductor substrate;

a horizontal semiconductor layer on the peripheral logic structure, the horizontal semiconductor layer comprising a cell array region and a connection region electrically connected to the cell array region;

electrode structures, each of the electrode structures comprising a plurality of electrodes stacked on the horizontal semiconductor layer in the cell array region and the connection region, the electrode structures, as viewed in a plan view, each extending in a first direction and being spaced apart from each other by at least one separation region in a second direction perpendicular to the first direction, the first and second directions defining a plane that is parallel to an upper surface of the semiconductor substrate, wherein the plurality of electrodes in each of the electrode structures, as viewed in a cross-sectional view, are stacked on the horizontal semiconductor layer in a third direction perpendicular to the first and second directions;

at least one contact region comprising a through wiring structure electrically connecting the electrode structures to the peripheral logic structure in the connection region; and ground select gate electrodes comprising lowermost electrodes among the plurality of electrodes of the electrode structures in the cell array region and the connection region, wherein at least one ground select gate cutting region is in contact with or overlaps the at least one contact region on a level of the ground select gate electrodes in the third direction, as viewed in a plan view, and electrically isolates the ground select gate electrodes from each other;

wherein the plurality of electrodes in each of at least a subset of the electrode structures are spaced apart from each other in the second direction by one or more gate isolation regions, each of at least a subset of the gate isolation regions comprising a first isolation region extending in the first direction and including a first end portion, and a second isolation region extending in the first direction and including a second end portion spaced apart from the first isolation region in the first direction, the first and second end portions being offset from one another in the second direction, and wherein the at least one ground select gate cutting region is arranged in the second direction and overlaps the first end portion of the first isolation region and the second end portion of the second isolation region in a planar manner.

14. The device of claim 13, wherein the cell array region has a first length in the second direction, and the connection region has a second length in the second direction, the second length being greater than the first length.

15. The device of claim 13,
wherein the cell array region comprises a plurality of memory blocks in the second direction,
wherein the memory blocks are divided into a first memory block group and a second memory block group,
wherein the connection region comprises a first connection region and a second connection region, and
wherein the first memory block group and the second memory block group are electrically connected to the first connection region and the second connection region, respectively, in the first direction on a first side and a second side of the cell array region, respectively.

16. The device of claim 13,
wherein the connection region comprises a stepped region of the plurality of electrodes, and
wherein the at least one ground select gate cutting region is in the cell array region or is in the connection region.

17. The device of claim 13,
wherein the plurality of electrodes in each of at least a subset of the electrode structures are spaced apart from each other in the second direction by one or more gate isolation regions, the gate isolation regions comprising a first end portion on the level of the ground select gate electrodes, and
wherein the at least one ground select gate cutting region overlaps a second end portion of the at least one separation region or overlaps a portion of the through wiring structure.

* * * * *